US012617553B2

(12) United States Patent
  Ekblaw et al.

(10) Patent No.: US 12,617,553 B2
(45) Date of Patent: May 5, 2026

(54) METHODS AND APPARATUS FOR AUTONOMOUS 3D SELF-ASSEMBLY, SPATIAL DOCKING AND RECONFIGURATION

(71) Applicant: Massachusetts Institute of Technology, Cambridge, MA (US)

(72) Inventors: Ariel Ekblaw, Somerville, MA (US); Joseph A. Paradiso, Medford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 18/822,860

(22) Filed: Sep. 3, 2024

(65) Prior Publication Data

US 2025/0066042 A1 Feb. 27, 2025

Related U.S. Application Data

(63) Continuation of application No. 17/591,234, filed on Feb. 2, 2022, now Pat. No. 12,110,131.
(Continued)

(51) Int. Cl.
  *B64G 1/22* (2006.01)
  *G01R 33/038* (2006.01)
(52) U.S. Cl.
  CPC ........... *B64G 1/22* (2013.01); *G01R 33/0385* (2013.01)
(58) Field of Classification Search
  CPC ... B64G 1/22; B64G 4/00; B64G 1/10; B64G 1/24; B64G 1/223; B64G 2004/005;
(Continued)

(56) References Cited

U.S. PATENT DOCUMENTS 7,815,149 B1 10/2010 Howard et al.
8,986,809 B2 3/2015 Gershenfeld et al.
(Continued)

OTHER PUBLICATIONS

Ekblaw, Ariel et al. "Self assemblig Space Architecture: Tessellated Shell Structured for Space Habitats" Jan. 2018 8 Pages (Year: 2018).*

(Continued)

*Primary Examiner* — Justin M Benedik
(74) *Attorney, Agent, or Firm* — Daly, Crowley, Mofford & Durkee, LLP

(57) ABSTRACT

A method for autonomously assembling a plurality of tiles is performed in a microgravity environment. Each tile includes a shell having a first geometrical shape and an arrangement of first magnets and a controller that are supported by the shell. The controller controls operation of the arrangement of first magnets to self-assemble the shell with another tile. The first magnets are controlled to mate with a complementary arrangement of second magnets on the other tile when the complementary arrangement of second magnets floats to within a range of magnetic attractive force of the arrangement of first magnets, with or without the aid of propulsion. The controllers in the tiles detect the status of the magnetic bonds to determine whether each pair of tiles is properly bonded or has a magnetic bond error. When an error is detected, the tiles are controlled to disassemble and reassemble to correct the error.

17 Claims, 16 Drawing Sheets

Related U.S. Application Data

(60) Provisional application No. 63/145,418, filed on Feb. 3, 2021.

(58) Field of Classification Search
CPC ...... B64G 1/66; G01R 33/0385; B25J 9/1682; B25J 9/1687
See application file for complete search history.

(56) References Cited

U.S. PATENT DOCUMENTS

| | | | |
|---|---|---|---|
| 10,526,095 B2 | 1/2020 | Blincow | |
| 11,014,303 B1 | 5/2021 | Higham et al. | |
| 11,999,513 B2 | 6/2024 | Uzo-Okoro et al. | |
| 12,110,131 B2 | 10/2024 | Ekblaw et al. | |
| 2017/0029765 A1* | 2/2017 | Vellinger | A61L 27/54 |
| 2017/0036783 A1 | 2/2017 | Snyder | |

OTHER PUBLICATIONS

Paper (Year: 2018).*
Barnhart, David, et al. "Changing Satellite Morphology Through Cellularization." AIAA SPACE 2012 Conference & Exposition; Sep. 11, 2012; 10 Pages.
Belvin, Wendel K., et al. "In-space structural assembly: Applications and technology." 3rd AIAA Spacecraft Structures Conference; Jan. 1, 2016; 11 Pages.
Bruner, Wesley, et al. "Mechanism analysis and verification approach for ISS truss assembly." 37th Aerospace Mechanisms Symposium; May 2004; 17 Pages.
"CubeSat Design Specifications (CDS)." CubeSat Design Specifications Rev. 12, The CubeSat Program, Cal Podly SLO; Aug. 1, 2009; 22 Pages.
Doggrell, Les. "Operationally Responsive Space: A Vision for The Future of Military Space" Air Univ Maxwell AFB AI Airpower Journal; Jan. 1, 2006; 11 Pages.
Doggett, William. "Robotic assembly of truss structures for space systems and future research plans." Proceedings, IEEE Aerospace Conference; Mar. 2002; 10 Pages.
Fiorillo, Fausto, et al. "Soft magnets for passive attitude stabilization of small satellites." IEEE Transactions on Magnetics; Jan. 19, 2010; 4 Pages.
Flores-Abad, Angel, et al. "A Review of Space Robotics Technologies for On-Orbit Servicing." Progress in Aerospace Sciences; Jul. 2014; 7 Pages.
Soulage, Michael et al. "Flexible, High Speed, Small Satellite Production." 33rd Annual AIAA/USU Conference on Small Satellites; Jul. 16, 2019; 4 Pages.
Grim, Braden, et al. "MakerSat: A CubeSat Designed for In-Space 3D Print and Assembly." 30 th Annual AIAA/USU Conference on Small Satellites; Aug. 5, 2016; 9 Pages.
Hill, Lisa, et al. "The Market for Satellite Cellularization: A Historical View of The Impact of The Satlet Morphology on The Space Industry." AIAA SPACE 2013 Conference and Exposition; Sep. 10, 2013; 12 Pages.
Hirzinger, Gerd, et al. "On a New Generation of Torque Controlled Light-Weight Robots." Proceedings 2001 ICRA. IEEE International Conference on Robotics and Automation (Cat. No. 01CH37164). vol. 4; May 2001; 8 Pages.
Hirzinger, G., et al. "Robotics and mechatronics in aerospace." 7th International Workshop on Advanced Motion Control. Proceedings (Cat. No. 02TH8623); Jul. 2002; 9 Pages.
Hirzinger, Gerd, et al. "Sensor-based space robotics-ROTEX and its telerobotic features." IEEE Transactions on robotics and automation; Oct. 1993; 15 Pages.
James, Stephen, et al. "Sim-to-real via sim-to-sim: Data-efficient robotic grasping via randomized-to-canonical adaptation networks." Proceedings of the IEEE/CVF Conference on Computer Vision and Pattern Recognition (CVPR); Jun. 2019; 11 Pages.

Jaeger, Talbot, et al. "Satlets-the Building Blocks of Future Satellites-And Which Mold Do You Use?" AIAA SPACE 2013 Conference and Exposition; Sep. 10, 2013; 11 Pages.
Kawasaki, Kazuyoshi. "Overview of JEM-EF on ISS." Proceedings of the RIKEN Symposium. Saitama; Feb. 27, 2009; 3 Pages.
Kelm, B.E. et al. "FREND: Pushing the Envelope of Space Robotics. Space Research and Satellite Technology." Naval Research Lab; Jan. 1, 2008; 4 Pages.
Kerzhner, Aleksandr A., et al. "Architecting Cellularized Space Systems Using Model-Based Design Exploration." AIAA SPACE 2013 Conference and Exposition; Sep. 10, 2013; 24 Pages.
Keys, Andrew, et al. "A review of NASA's radiation-hardened electronics for space environments project." AIAA SPACE 2008 Conference & Exposition; Jun. 15, 2012; 7 Pages.
Kingsbury, R., et al. "TID tolerance of popular CubeSat components." 2013 IEEE Radiation Effects Data Workshop (REDW); Jul. 2013; 5 Pages.
Langford, Will, et al. "Hierarchical assembly of a self-replicating spacecraft." 2017 IEEE Aerospace Conference; Mar. 2017; 11 Pages.
Laryssa, Patten, et al. "International Space Station Robotics: A Comparative Study of ERA, JEMRMS and MSS." 7th ESA Workshop on Advanced Space Technologies for Robotics and Automation 'ASTRA 2002' ESTEC; Nov. 2002; 8 Pages.
LeMaster, Edward, et al. "Experimental Demonstration of Technologies for Autonomous On-Orbit Robotic Assembly." Space 2006; Jun. 18, 2012; 14 Pages.
Li, Y. F. et al. "On the dynamic behavior of a force/torque sensor for robots." Proceedings 2001 ICRA. IEEE International Conference on Robotics and Automation (Cat. No. 01CH37164); Feb. 1998; 5 Pages.
Liu, Guangjun, et al. "A base force/torque sensor approach to robot manipulator inertial parameter estimation." 1998 IEEE International Conference on Robotics and Automation (Cat No. 98CH36146); May 1998; 6 Pages.
Lymer, John, et al. "Commercial application of in-space assembly." AIAA SPACE 2016; Sep. 9, 2016; 17 Pages.
"MakerSat: A CubeSat mission designed for In-Space 3D Print and Assembly" https://directory.eoportal.org/web/eoportal/satellite-missions/m/makersat; Aug. 2016; 16 Pages.
Murbach, Marcus S., et al. "The SPQR as an Option for Returning Payloads from the ISS after the Termination of STS Flights." Proceedings of the 40th International Conference on Environmental System; Jul. 2010; 12 Pages.
Murugesan, S. "An overview of electric motors for space applications." IEEE Transactions on Industrial Electronics and Control Instrumentation; Nov. 1981; 6 Pages.
Nogales, Connor "NNU's MakerSat-1 CubeSat Assembly" https://www.youtube.com/watch?v=shLPETczsF4; Jan. 19, 2017; 1 Page.
Paus, Fabian, et al. "A combined approach for robot placement and coverage path planning for mobile manipulation." 2017 IEEE/RSJ International Conference on Intelligent Robots and Systems (IROS); Sep. 2017; 8 Pages.
Rawashdeh, Samir Ahmed. "Passive attitude stabilization for small satellites." Jan. 2010; 73 Pages.
Roa, Maximo A., et al. "Robotic Technologies for In-Space Assembly Operations." 14th Symposium Advanced Space Technologies in Robotics and Automation (ASTRA); Jun. 2017; 8 Pages.
Selva, Daniel, et al. "A Survey and Assessment of the Capabilities of Cubesats for Earth observation." Acta Astronautica; May 2012; 20 Pages.
Shimmin, Rogan, et al. "The successful PhoneSat WiFi experiment on the Soarex-8 flight." 2016 IEEE Aerospace Conference; Mar. 2016; 10 Pages.
Sternberg, David, et al. "Multidisciplinary system design optimization of on orbit satellite assembly architectures." 2015 IEEE Aerospace Conference; Mar. 2015; 15 Pages.
Spensieri, Domenico, et al. "Optimal robot placement for tasks execution." Procedia CIRP; May 11, 2016; 6 Pages.
Stevo, Stanislav, et al. "Optimization of robotic arm trajectory using genetic algorithm." IFAC Proceedings; Aug. 2014; 6 Pages.
Springmann, John C. et al. "Investigation of the on-orbit conjunction between the MCubed and HRBE CubeSats." 2013 IEEE Aerospace Conference; Mar. 2013; 8 Pages.

(56)     References Cited

OTHER PUBLICATIONS

Tsujimura, Takeshi, and Tetsuro Yabuta. "Object detection by tactile sensing method employing force/torque information." IEEE Transactions on robotics and Automation; Aug. 1989; 7 Pages.

Walker, Roger, et al. "Deep-space CubeSats: thinking inside the box." Astronomy & Geophysics; Oct. 2018; 7 Pages.

Abdel-Rahman, Amira et al. "Space Ants: Constructing and Reconfiguring Large-Scale Structures with Finite Automata (Media Exposition)." 36th International Symposium on Computational Geometry; Jan. 1, 2020; 6 Pages.

Ekblaw, Ariel et al. "Self-Assembling Space Structures: Buckminsterfullerene Sensor Nodes." 2018 AIAA/AHS Adaptive Structures Conference; Jan. 2018; 15 Pages.

Ekblaw, Ariel et al. "TESSERAE: Self-Assembling Shell Structures for Space Exploration." International Association of Shell and Spatial Structures (IASS); Jul. 16, 2018; 8 Pages.

Ekblaw, Ariel et al. "Self-assembling Space Architecture: Tessellated Shell Structures for Space Habitats." Proceedings of the Annual Symposium of the International Association of Shell and Spatial Structures (IASS): Extraplanetary Architecture; 2018; 12 Pages.

Ekblaw, Ariel et al. "Self-Assembling Space Habitats: TESSERAE: Design and Mission Architecture." 2019 IEEE Aerospace Conference; Mar. 2019; 11 Pages.

Ekblaw, Ariel et al. "Space Habitat Reconfigurability: TESSERAE: Platform for Self-Aware assembly." 70th International Astronautical Congress (IAC) by the International Astronautical Federation (IAF); Oct. 2019; 12 Pages.

Ekblaw, Ariel C. "Self-Aware Self-Assembly for Space Architecture: Growth Paradigms for In-Space Manufacturing." PhD diss., Massachusetts Institute of Technology; Sep. 2020; 231 Pages.

Ekblaw, Ariel et al. "Self-Assembling and Self-Regulating Space Stations: Mission Concepts for Modular, Autonomous Habitats." 50th International Conference on Environmental Systems; Jul. 2021; 16 Pages.

Gettliffe, Gwendolyn Vines. "Stability Analysis of Electromagnetically Supported Large Space Structures." PhD diss., Massachusetts Institute of Technology; Feb. 2016; 261 Pages.

Gilpin, Kyle et al. "Robot Pebbles: One Centimeter Modules for Programmable Matter Through Self-Disassembly." 2010 IEEE International Conference on Robotics and Automation; May 2010; 9 Pages.

Hacohen, Adar et al. "Meshing Complex Macro-Scale Objects into Self-Assembling Bricks." Scientific Reports; Jul. 30, 2015; 8 Pages.

Haghighat, Bahar et al. "Lily: A Miniature Floating Robotic Platform for Programmable Stochastic Self-Assembly." 2015 IEEE International Conference on Robotics and Automation (ICRA); May 2015; 8 Pages.

Jenett, Benjamin et al. "Design of Multifunctional Hierarchical Space Structures." 2017 IEEE Aerospace Conference; Mar. 2017; 10 Pages.

Knaian, Ara N. "Electropermanent Magnetic Connectors and Actuators: Devices and Their Application in Programmable Matter." Doctoral Dissertation, Massachusetts Institute of Technology; 2010; 208 Pages.

Kong, Edmund Mun Choong. "Spacecraft Formation Flight Exploiting Potential Fields." PhD diss., Massachusetts Institute of Technology; 2002; 184 Pages.

Lee, Nicolas N. et al. "Architecture for In-Space Robotic Assembly of a Modular Space Telescope." Journal of Astronomical Telescopes, Instruments, and Systems; Jul. 11, 2016; 16 Pages.

Nisser, Martin et al. "An Electromagnetically Actuated, Self-Reconfigurable Space Structure." JSASS Aerospace Tech. Japan; Apr. 16, 2017; 9 Pages.

Otero, Alvar Saenz et al. "SPHERES: Development of an ISS laboratory for formation flight and docking research." IEEE Aerospace Conference; Mar. 2002; 15 Pages.

Pei, Jing et al. "Autonomous Rendezvous and Docking of Two 3U Cubesats Using a Novel Permanent-Magnet Docking Mechanism" 54th AIAA Aerospace Sciences Meeting, AIAA SciTech Forum; Jan. 2016; 14 Pages.

Pettazzi, Lorenzo et al. "Electrostatic Forces for Satellite Swarm Navigation and Reconfiguration." ESA Final Report; Jun. 2006; 113 Pages.

"Self-Assembly Lab" https://selfassemblylab.mit.edu/; Accessed May 25, 2017; 1 Page.

Tibbits, Skylar et al. "Biomolecular, Chiral and Irregular Self-Assemblies." 33rd Annual Conference of the Association for Computer Aided Design in Architecture; Oct. 2013; 8 Pages.

Whitesides, George M. et al. "Self-assembly at all scales." Science; Mar. 29, 2002; 4 Pages.

Whitesides, George M. et al. "Beyond molecules: Self-assembly of mesoscopic and macroscopic components." National Academy of Sciences; Apr. 16, 2002; 6 Pages.

Domingos, Jorge L.C. et al. "Self-assembly of Rigid Magnetic Rods Consisting of Single Dipolar Beads in Two Dimensions." Physical Review E; Jul. 17, 2017; 9 Pages.

Rubenstein, Michael et al. "Programmable self-assembly in a thousand-robot swarm." Science; Aug. 15, 2014; 6 Pages.

Tibbits, Skylar et al. "Programmable materials for architectural assembly and automation." Assembly Automation; Jul. 27, 2012; 11 Pages.

Joppin, Carole et al.; "On-Orbit Upgrade and Repair: The Hubble Space Telescope Example"; Journal of Spacecraft and Rockets; vol. 43, No. 3; May-Jun. 2006; 12 Pages.

Karlow, Brandon, et al.; "Tradespace investigation of strategic design factors for large space telescopes"; Journal of Astronomical Telescopes, Instruments, and Systems; vol. 1, No. 2; Apr.-Jun. 2015; 23 Pages.

Northrop Grumman; "Companies Demonstrate Groundbreaking Satellite Life-Extension Service"; Northrop Grumman Newsroom (https://news.northropgrumman.com/news/releases/northrop-grumman-successfully-completes-historic-first-docking-of-mission-extension-vehicle-with-intelsat-901-satellite); Feb. 26, 2020; 3 Pages.

Rodgers, Lennon, et al.; "Development of the miniature video docking sensor"; Proc. SPIE 6221, Modeling, Simulation, and Verification of Space-based Systems III, 62210E; May 31, 2006; 13 Pages.

Steimle, Per C., et al. "Commercial Approach to Research Outside the International Space Station—A Small Size Precursor Service for Future In-Orbit Testing"; AIAA SPACE 2014 Conference and Exposition; Aug. 4-7, 2014; 11 Pages.

Steimle, Christian, et al.; "ISS External Payload Platform—a new opportunity for research in the space environment"; 40th COSPAR Scientific Assembly; Aug. 2014; 1 Page.

Sun, Yongjun, et al. "Design and Optimization of a Novel Six-Axis Force/Torque Sensor for Space Robot"; Proceeding of the IEEE International Conference on Robotics and Biomimetics (ROBIO); Dec. 2013; 8 Pages.

Walker, Michael, et al.; "An Adaptive control of space-based robot manipulators"; IEEE Transactions on Robotics and Automation; vol. 7, No. 6; Dec. 1991; 8 Pages.

Zuniga, David, et al.; "Conceptual Development of a Payload Thermal and Pressure Control System for a Small Payload Quick Return Vehicle"; 40th International Conference on Environmental Systems; Jul. 2010; 9 Pages.

U.S. Notice of Allowance dated Oct. 12, 2023 for U.S. Appl. No. 17/523,656; 18 pages.

Bualat et al.; "Astrobee: Developing a free-flying robot for the international space station"; Aerospace Research Central; Aug. 28, 2015; 10 Pages.

Katz et al.; "NASA advances robotic space exploration"; Computer—Printed by IEEE Computer Society—Cover Feature; Jan. 2003; 10 Pages.

Mohon; "NASA's Dragonfly Project Demonstrates Robotic Satellite Assembly Critical to Future Space Infrastructure Development"; Sep. 13, 2017; 5 Pages.

Nanoracks "How to build a nanolab payload"; Powerpoint Presentation; https://nanoracks.com/wp-content/uploads/How-to-Build-a-NanoRacks-Payload.pdf; Printed Nov. 28, 2023; 15 Pages.

(56)  References Cited

OTHER PUBLICATIONS

Nanoracks Technical Resources; https://nanoracks.com/resources/; 6 pages.
NASA "CubeSat Launch Initiative"; https://www.nasa.gov/kennedy/launch-services-program/cubesat-launch-initiative/; Printed Nov. 28, 2023; 7 Pages.
NASA "International Space Station"; https://www.nasa.gov/international-space-station/; Printed Nov. 28, 2023; 13 Pages.
Patane et al.; "Design Reference Missions for Archinaut: A Roadmap for In-Space Robotic Manufacturing and Assembly"; AIAA; Manufacturing and Construction Technologies; Sep. 15, 2018; 7 Pages.
Piskorz et al.; "On-Orbit Assembly of Space Assets: A Path to Affordable and Adaptable Space Infrastructure"; The Aerospace Corporation; Center for Space Policy and Strategy; Feb. 2018; 12 Pages.
Putz; "Space robotics in Europe: A survey"; Robotics and Autonomous Systems; vol. 23; 1998; 14 Pages.
Reed et al.; "The Restore-L Servicing Mission"; Presented to the NAC Technology, Innovation and Engineering Committee; Mar. 29, 2016; 32 Pages.
Sallaberger et al.; "Canadian space robotic activities"; Acta Astronautica; vol. 41, No. 4; 1997; 8 Pages.
Saplan; "Robotic Servicing of Geosynchronous Satellites (RSGS)"; https://www.darpa.mil/program/robotic-servicing-of-geosynchronous-satellites; Printed Nov. 16, 2023; 3 Pages.

Sinclair et al.; "Radiation effects and COTS parts in SmallSats"; 2013; 12 Pages.
Trad.fr. Home Page; https://trad.fr; Nov. 28, 2023; 5 Pages.
Underwood et al.; "Using CubeSat/micro-satellite technology to demonstrate the autonomous assembly of a reconfigurable space telescope"; Acta Astronautica; vol. 114; 2015; 11 Pages.
Watson et al.; "A history of astronaut construction of large space structure at NASA Langley Research center"; Proceedings, IEEE Aerospace Conference; vol. 7; Mar. 9, 2002; 18 Pages.
Weisbin et al.; "NASA robotics research for planetary surface exploration"; IEEE Robotics & Automation Magazine; Dec. 2000; 10 Pages.
Whelan et al.; "DARPA orbital express program: effecting a revolution in space-based system"; Proceedings of SPIE; 4136; Small Payloads in Space; Nov. 7, 2000; 10 Pages.
Request for Continued Examination dated Jan. 12, 2024 for U.S. Appl. No. 17/523,656; 3 Pages.
Amendment dated Jan. 12, 2024 for U.S. Appl. No. 17/523,656; 15 Pages.
Notice of Allowance dated Feb. 7, 2024, for U.S. Appl. No. 17/523,656; 10 pages.
Office Action dated Feb. 28, 2024 for U.S. Appl. No. 17/591,234; 8 Pages.
Response to Office Action dated Feb. 28, 2024 for U.S. Appl. No. 17/591,234, filed May 23, 2024; 11 Pages.
Notice of Allowance dated Jun. 12, 2024 for U.S. Appl. No. 17/591,234; 7 Pages.

* cited by examiner

575

585

| Size (hexagon widest diameter, to nearest cm) | 10cm |
|---|---|
| Count fabricated | 7 final, from 15 + test units |
| Magnet Type | EPM - custom |
| Joint Type | Hex/Pent SS/NN Hes/Hex SN/SN |
| Sensing | Refined Code and major modifications to state machine control loop<br><br>Mother Board<br>● Combined IMU<br>● 3x ToF<br>Peripheral Boards<br>● Magnetometer<br>● RGB + Proximity Gesture |
| Communication | BLE |
| Data Storage | MicroSD |
| Programming Interface | USB Arduino Bootloader |
| Active Control | Joint Repulsion and Seperation |
| Power System | Coin Cell Li-ion + Recharging Apparatus + Supercapacitor discharge for EPMs + extensive protection circuitry |

*FIG. 14*

METHODS AND APPARATUS FOR AUTONOMOUS 3D SELF-ASSEMBLY, SPATIAL DOCKING AND RECONFIGURATION

CROSS-REFERENCE TO RELATED APPLICATIONS

This application is a continuation of U.S. patent application Ser. No. 17/591,234 filed on Feb. 2, 2022, which claims benefit of U.S. Provisional Patent Application Ser. No. 63/145,418, the contents of which are incorporated by reference herein.

FIELD

One or more embodiments described herein relate to autonomous self-assembly of structures in reduced-gravity environments.

BACKGROUND

Research and development of space-based applications has increased significantly in recent years. In addition to the deployment of next-generation communication satellites and space vehicle design, there is extensive interest in space-station systems, global mapping solutions, navigation and location services, sensor imagery, deep-space exploration, and now space tourism.

While many valuable advancements have been made in these areas, one area that continues to lag behind is space structure assemblies and related assembly techniques. Existing methods require human intervention or robotic arms to manage and perform the assembly. This is not only dangerous, but is also time-consuming, expensive and requires the use of specially trained personnel and external equipment (adding additional costly mass to space missions). These problems are also applicable to other types of reduced-gravity environments, including but not limited to those involving drone use.

SUMMARY OF THE INVENTION

One or more embodiments described herein relate to a tile which may be used in the autonomous self-assembly of one or more structures in a reduced-gravity environment.

In accordance with one or more embodiments, a tile includes a shell having a first geometrical shape, an arrangement of first magnets supported by the shell, a controller, within the shell, configured to control operation of the arrangement of first magnets to assemble the shell with at least one other tile in a microgravity environment. The arrangement of first magnets is controlled to mate with a complementary arrangement of second magnets on the at least one other tile when the complementary arrangement of second magnets is within a range of magnetic attractive force of the arrangement of first magnets. The controller may also detect an aligned magnetic bond between one of the first magnets and one of the second magnets and detect a magnetic bond error between one of the first magnets and one of the second magnets.

In one embodiment, the controller may determine the status of a magnetic bond between one of the first magnets and one of the second magnets based a confirmation signal from said another tile. The confirmation signal may include one or more optical signals. In one case, a first color of light or modulated optical code may be indicative of a magnetic bond error, and a second color of light or modulated optical code is indicative of an aligned magnetic bond. In one embodiment, the shell may include a light window facing said another tile, and the light emitter is configured to transmit the predetermined color of light or modulated optical code to said another tile through the light window.

In accordance with one or more other embodiments, a method for performing self-assembly and reconfiguration of structures includes autonomously assembling a plurality of tiles to form a first structure, the plurality of tiles including controllers configured to control magnets on sides of the plurality of tiles to bond the plurality of tiles together to form the first structure; generating or receiving information to reconfigure the plurality of tiles to form a second structure different from the first structure; controlling release of magnetic bonds between the magnets of at least a portion of the plurality of tiles based on the information; and autonomously assembling at least the portion of the plurality of tiles to form the second structure, the second structure formed by controlling operation of magnets on sides of at least the portion of the plurality of tiles to bond the plurality of tiles together, wherein the plurality of tiles are autonomously assembled to form the first structure and autonomously assembled to form the second structure in a microgravity environment.

BRIEF DESCRIPTION OF THE DRAWINGS

FIG. 14 is a table illustrating example parameters smart tile;

DETAILED DESCRIPTION

In general overview, described herein is smart tile (sometimes referred to herein as a "tile"), various structures formed by joining a plurality of smart tiles and an associated system and method for performing autonomous three-dimensional self-assembly of two or more smart tiles to form one or more structures in a microgravity environment. The structure(s) formed by joining smart tiles may take various forms depending, for example, upon the intended application of the smart tile and/or structure.

For example, the structure(s) may be included as part of, or correspond to, a space station or any of its attendant areas or sections. In some embodiments, the structure(s) may form a satellite or other orbiting body, including but not limited to a telescope or (e.g., parabolic, ferromagnetic fluid, or another type of) mirror. In a mirror application, a plurality of smart tiles may be used to form a predetermined (e.g., curved, straight, etc.) framework used to support the mirror. The structure(s) may also provide a framework to support solar panels or other functional or structural surfaces. In other embodiments, the structure may form a storage chamber, space port, or logistics depot. In still other embodiments, the structure may form part of a space vehicle designed to perform a predetermined task or a human habitat, work environment or other infrastructure for use in space or on a planet.

Figures 1A, 1B:
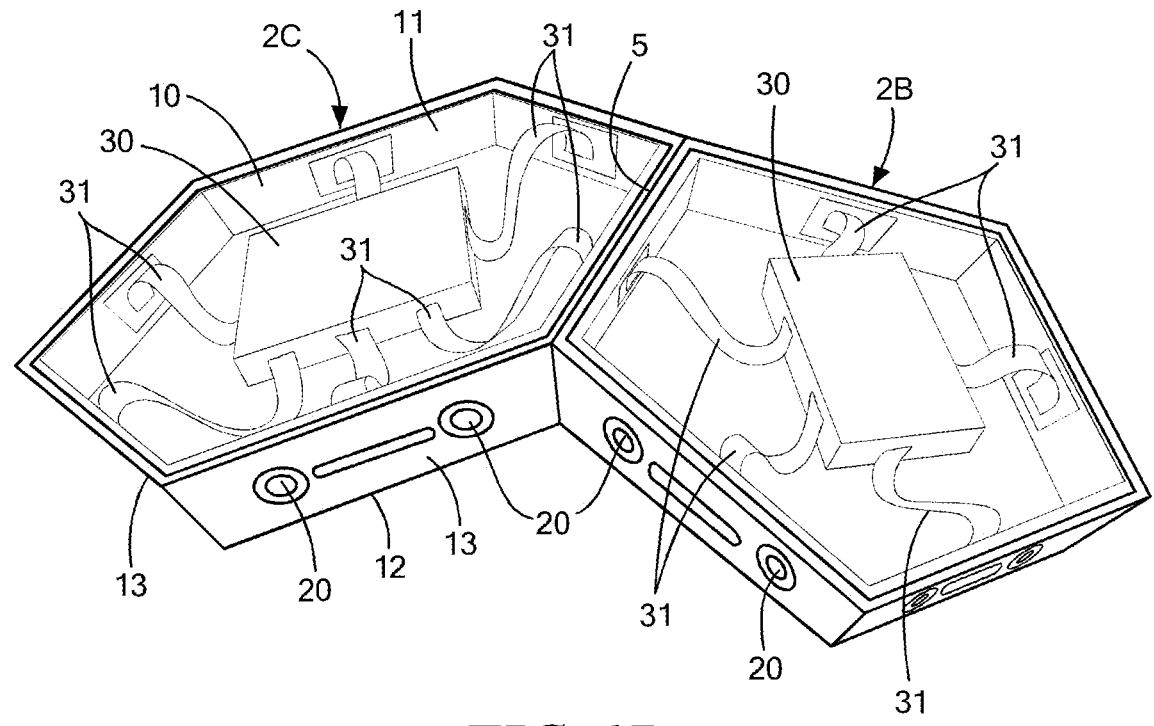
FIG. 1A is a perspective view of an embodiment of three coupled smart tiles.
FIG. 1B is a perspective view of a pair of smart tiles illustrate in FIG. 1A.

Referring now to FIGS. 1A and 1B in which like elements are provided have like reference designations, a structure 1 is formed from a plurality of smart tiles, here three smart tiles 2A, 2B, 2C. Taking smart tile 2A as representative of tiles 2B, 2C, tile 2A includes an arrangement of magnets 20 in a shell 10. The shell serves as a three-dimensional housing for various structures of the smart tile that enable operational control during assembly or "mating" of one tile to one or more other tiles (e.g. the mating or joining of tile 2A to tiles 2B, 2C) as will be described below. The shell has predetermined dimensions (i.e., length, width and depth), with the depth selected to accommodate structures to be housed within the shell. The particular dimensions of the shell and tile as well as the shapes of the shell and tile may be selected to suit the needs of a particular application. After reading the disclosure provided herein, one of ordinary skill in the art will appreciate how to select tile and shell shapes and dimensions to fit the needs of a particular application.

Structurally, shell 10 has a top and bottom surfaces 11, 12 (with surface 11 here being transparent so as to reveal underlying structure and circuits) and a plurality of side surfaces 13. The top surface 11 of the tile may be substantially flat, convex or concave shape. Other shapes may also be used. Similarly, bottom surface 12 may be substantially flat, convex, concave or other shape. In one embodiment, the bottom surface and top surface may have complementary shapes (e.g., one surface may be concave and the other convex) or both may have substantially the same shape.

One or more of sides surfaces may be pitched or tapered at a predetermined angle or one or more of which may be substantially straight (e.g., vertical) depending, for example, upon its location in a structure to be formed by assembly (or mating or joining) of two or more tiles. The side surfaces 13 may separate (or space apart) the top surface from the bottom surface to provide clearance (or form a space, opening or region) for housing structures and/or circuit components of the tile. It should be appreciated that side surfaces 13 need not all have the same shape or structural dimensions. When the side surfaces are angled or tapered, the top surface and bottom surface may have different areas, e.g., the area of the top surface 11 may be greater than the area of the bottom surface 12.

The size dimensions and angular coupling of the various surfaces of the smart tile may define a predetermined geometrical shape. The shape may be, for example, a three-dimensional polygonal shape, with each side surface arranged to be assembled with a complementary side surface of another tile. For example, one side surface of the smart tile may be inclined at an angle for purposes of coupling to the side surface of another tile inclined at a complementary angle. The other smart tiles to be assembled with respective side surfaces of the shell 10 may have the same geometrical shape as the shell 10 or may have a different geometrical shape, for example, depending on the intended structure to be formed. The intended structure may have a substantially spherical (e.g., buckyball) shape, rectangular shape, irregular shape, or another shape to meet the requirements of the intended application.

In the example embodiment shown in FIGS. 1A and 1B, the shell 10 of smart tile 2A has a hexagonal shape (and thus smart tile 2A may also be said to have a hexagonal shape) while the shell 10 of smart tile 2B has a pentagonal shape (and thus smart tile 2B may also be said to have a pentagonal shape). As illustrated side surface 5 of tile 2A is coupled, assembled or otherwise joined to a side surface 5 of smart tile 2B. The different geometrical shapes of tiles 2A and 2B will cause the tiles to be pitched at a predetermined angle relative to one another, causing what will appear to be a substantially bending or curving shape. Such an effectively curved coupling may be desired, for example, when it is desired to form a completed structure having at least a portion which is spherical (e.g., buckyball), elliptical, toroidal, or another three-dimensional shape with one or more curved, angled or rounded surfaces.

The material of the shell is intended to be sufficiently durable to withstand the conditions in which it is to be employed. In one embodiment, the shell material may be opaque. In other embodiments, the shell material may be translucent or transparent. The shell may be made opaque, for example, in order to block radiation from powerful sunlight in the vacuum of space. The shell may be made transparent, for example, in order to allow a technician to view the internal components of the smart tile or to provide a functional or aesthetic view. In one embodiment, the completed structure may have a combination of different visibilities to accomplish an intended application. When used in space, the shell of the smart tile may, for example, be made of various materials including but not limited to various types of metals (e.g., aluminum), carbon fiber, polymers, and/or composite materials.

In order for the multiple side surfaces of smart tile 2A to be assembled with other smart tiles, each side surface of the tile may include an arrangement of one or more magnets 20. The magnet(s) may, for example, be electromagnets, electro-permanent magnets, or a combination of one or more electromagnets and one or more electro-permanent magnets. The magnets may be visible along the side surfaces or may be hidden (or covered) by an outer material of the side surface, provided in the latter case the electromagnetic field generated by the electromagnet is sufficient to achieve the desired aligned coupling, examples of which are described in greater detail below. For the sake of discussion, each side surface of the tile will be discussed as having more than one magnet. After reading the description provided herein, those of ordinary skill in the art will appreciate that in some applications it may be desirable or necessary to utilize tiles having one or more side which include only one magnet.

The arrangement of magnets 20 may be sufficient to ensure a magnetic bond of at least a predetermined force with an arrangement of magnets on a mating surface of an adjacent tile. The strength of the bond may be set, for example, to withstand external forces (e.g., rotational or other forms of movement, impact from debris, etc.) and internal forces (e.g., pressurization in the space habitat application) that may be expected to occur in the micro-gravity environment in which the completed structure is to be used. Conversely, the strength of the bond may only be sufficient to accrete and secure the structure during assembly, after which the tiles may bond together using, for example, strong mechanical clamps or sealants. The strength of the magnetic bond may be determined, for example, based on at least the strength of the magnetic cores of the magnets. The position and location of the magnets 20 on each side surface of the smart tile may be selected to ensure proper alignment with an adjacent tile, via an intentionally design "magnet polarity map", as a result magnetically joining or bonding complementary pairs of magnets on the mating tiles (i.e., bonding one or more magnets having a first magnetic polarity to one or more magnets having a second magnetic polarity wherein the first magnetic polarity is opposite the second magnetic polarity). It is noted that magnets on tiles to be joined may or may not be provided having physically complementary shapes. For example, magnetically bonded magnets may both have a flat surface (i.e., magnets on tiles to be joined (or at least mating surfaces of magnets to be joined) may be provided having the same shape).

In the example of FIGS. 1A and 1B, each of the side surfaces 13 have two magnets 20 (which may, for example, be electro-permanent magnets 20) that are horizontally aligned in a spaced configuration (i.e., the "faces" of each magnet are aligned). However, in other embodiments, the side surfaces may have a different arrangement of magnets (e.g. a different number or spacing of magnets). In one embodiment, at least one side surface of tile 2A may have a different arrangement of magnets than at least one other side surface of this tile, depending upon the intended structure to be formed. The different arrangement may have, for example, a greater number of magnets or fewer magnets depending upon a location of a smart tile within an assembled structure. For example, it may be desirable for smart tiles located about an outside perimeter of a formed structure to have a greater number of engaged (or mated or magnetically bonded) magnets than smart tiles "internal" to (i.e. smart tiles surrounded by perimeter tiles) the formed structure.

In embodiments in which tiles comprise one or more electromagnets, the electromagnets may be electro-permanent magnets (EPMs). Other types of magnets may, of course, also be used. In one embodiment, when electro-permanent magnets are used, the electro-permanent magnets may be permanent magnets that can be electrically deactivated or reversed, for example, in a pulsing or other fashion. In one embodiment, the magnets may be switching permanent magnets, e.g., magnets that can be mechanically turned off, for example, like the magnets on a magnetic lifting bar. In one embodiment, the magnets may be "pixel" magnets (e.g., like QR codes with much more granular field patterns).

The shell of the smart tile houses a controller 30 along with a plurality of electronic components for controlling operation of the assembly process. The controller 30 may be mounted on or otherwise disposed on or coupled to a printed circuit board within the shell 10 and, for example, may be implemented as one or more integrated circuit chips. Examples of the controller 30 include, but are not limited to, one or more integrated circuits, one or more microcontrollers, one or more controllers, one or more microprocessors, one or more processors, one or more field-programmable gate arrays, one or more personal computers, one or more onboard computers, one or more remote computers, one or more servers, one or more network hosts, one or more client computers, or another type of signal processing or logic device (collectively "processing devices"). The controller may thus be implemented as one or more processing devices.

In one embodiment, the controller 30 may operate independently from the controllers of other smart tiles, e.g., each smart tile used to form the self-assembled structure may operate in a decentralized (or distributed) manner, as opposed to a situation where a central controller controls operation and assembly of the tiles. Whether a distributed or central controller is used, a self-assembly operation may be based upon signals exchanged between the tiles. In embodiments, the controller 30 may operate in cooperation with information received from the other tiles. In a third embodiment, the tile controller(s) may operate with instructions from a central base station node for fully centralized control. For example, one tile of a plurality of tiles may act as a base station or central controller for other tiles of the plurality of tiles. Embodiments describing the transmission and reception of information between tiles via light signals is described in greater detail below. In one embodiment, information may be exchanged between tiles (e.g., for the purpose of coordinating the mating of tiles) via the exchange of radio frequency (rf) signals.

Operation of the controllers in each tile may be initiated, for example, by a trigger signal. This may occur, for example, when the tiles are released from a storage or holding area into in the microgravity environment or at another time such as when an error condition or reassembly operation is to be performed. The storage or holding area may be, for example, the storage bay of a space shuttle or other spacecraft, the storage or holding bay of a space station or satellite, or the storage or holding area of another structure.

When initiated, the controller 30 executes instructions (e.g., software, firmware, middleware, or other instructions) to control a variety of predetermined operations. These operations include control of the magnets on the side surfaces of the shell (e.g. magnets 20 in FIGS. 1A, 1B). For example, when magnets (e.g. electro-permanent magnets) of another tile float into the magnetic field of the magnets (e.g. electro-permanent magnets) on one side surface of smart tile 1 and/or with another type of sensing range of the tile (e.g., as determined by a proximity sensor), controller 30 may respond by initiating one or more state machines to control assembly. This may be accomplished in a passive or active manner.

For example, in a passive application a tile floating near smart tile 1 (e.g., in a microgravity environment) may be attracted to one side surface 13 as a result of the attractive force of one or more magnets on that side surface (e.g., as a result of an attractive force of a permanent magnetic core of an electro-permanent magnets on that side surface). The strength of the magnet core may be predetermined to provide at least a minimum attractive force at a certain range from the smart tile 1. The magnet(s) (e.g. electro-permanent magnet(s)) on smart tile 1 may mate with magnets (e.g., electro-permanent magnets) of the floating tile (e.g., tile 2) as a result of a magnetic bond created by the attractive force. Such a passive application may be considered to be beneficial in terms of power consumption.

In an active application, the controller 30 may allow a power source to activate the coils of the electro-permanent magnets on side surface 13. For example, when the electro-magnets are EPMs, the controller may control switching (e.g., pulse off or reverse polarity) of the electromagnets using a pulse of electric current in a wire wound around the magnet to deactivate an attractive magnetic field or generate repulsion between the magnets by reversing a magnetic polarity. The attractive magnetic field may draw the floating tile into contact with the smart tile 1 to form a magnetic bond for assembly. In one embodiment, the controller 30 may activate the coil of the electromagnet to generate an repulsive force for error correction purposes, embodiments of which are described in detail below. Such repulsive force may be generated when magnetic bonds are created by passive or active applications. In the case where regular electromagnets are used, they can be made to be mutually attractive or repulsive, according to the polarity of current flow through the magnet coils, with the amount of force between magnets governed by the average value of current through the coils. Here, the magnets could be pulsed on momentarily to correct the velocities of tiles being assembled, in a similar manner to how jets are used in docking operations. The difference between regular electromagnets and electro-permanent magnets are that the latter are normally 'on' without current flowing while the former are normally 'off' when no current flows.

Figures 2, 3, 4:
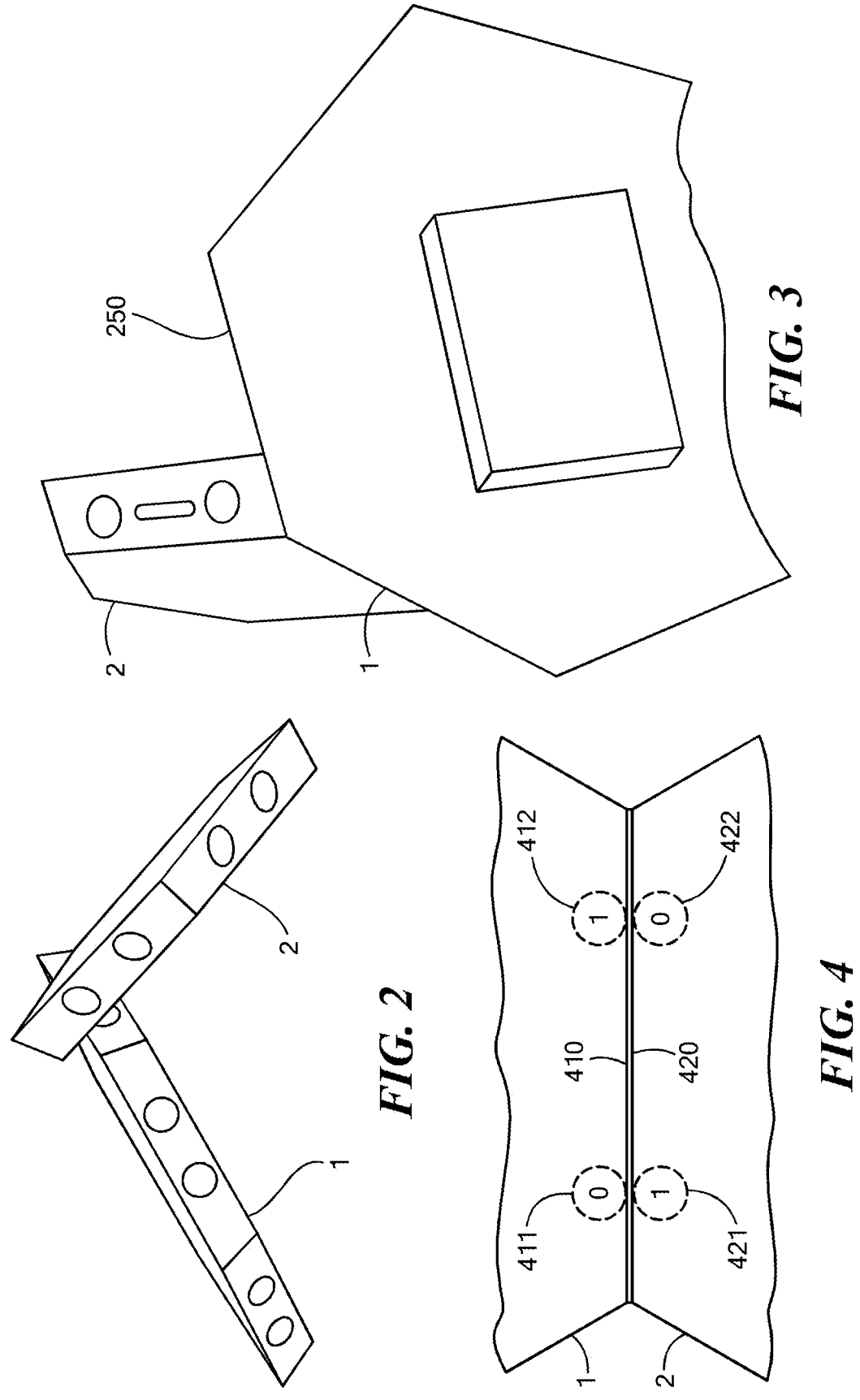
FIG. 2 is a side view of a pair of tiles ineffectively coupled via a magnetic bond (i.e. an example of a magnetic bond error between tiles that the invention corrects for)
FIG. 3 is a perspective view of a pair of tiles ineffectively coupled via a magnetic bond (i.e. an example of a magnetic bond error between tiles that the invention corrects for)
FIG. 4 is a perspective view of a pair of tiles ineffectively coupled via a magnetic bond (i.e. an example of a magnetic bond error between tiles that the invention corrects for)

During assembly, it is possible (and in some applications, perhaps likely) that in some cases a magnetic bond error may occur between two tiles. A magnetic bond error may occur when the magnetic bond formed between two tiles is misaligned or otherwise improper. Two examples of a magnetic bond error includes a meta-stable bond and an inverted bond. A meta-stable bond may occur when two tiles bond together out-of-plane. An example of a meta-stable bond is shown in FIG. 2, where only one magnet-pair of the double-sided magnet face successfully bonds An inverted bond may occur when two tiles bond correctly in plane, and their bonding faces are Right-Left aligned, but one tile is inverted 180 degrees. An example of an inverted bond is shown in FIG. 4.

Thus, another operation of controller 30 is to determine whether a proper bond has been formed for each of the side surfaces of smart tile 1. In one embodiment, a proper bond may include a bond where the magnets of one tile are aligned and bonded to the magnets of another tile, e.g., such bonded magnets may be axially aligned relative to their centers. Such an alignment may cause corresponding side surfaces of the tiles to be in alignment relative to one or more axis. If the controller determines that a proper bond exists for any given side, then the smart tile may be determined to have been properly assembled to the other tile on that side. In such a case, the bond may be maintained and in some embodiments strengthened or secured, for example, either by increasing the magnetic attractive force and/or applying a clamp or other additional securing force or structure. If the controller 30 determines that there is an assembly error resulting from an improper bond, then a corrective operation may be performed.

In one embodiment, the controller 30 may therefore be said to perform alignment and bonding error detection. The alignment and bonding error detection may be performed using one or more sensors located within the shell of the smart tile. In one embodiment, in which magnetic fields form the bond between tiles, each side surface of the smart tile may be equipped with at least one magnetic field sensor (e.g. a magnetometer) configured to measure, sense or otherwise detect one or more characteristics (e.g. magnitude, direction, etc. . . . ) of one or more magnetic fields of the magnet(s) on that side. Such characteristics may be said to form a baseline "signature" against which other states may be compared when neighboring tiles are in proximity (e.g. tiles floating nearby if the tiles are in a microgravity environment) for prospective bonding events. The measured (or sensed or otherwise detected) magnetic field strength may be output to the controller 30 as a detection signal for bond evaluation.

For example, in some embodiments, the magnetic field sensor (e.g. a magnetometer) may be surrounded by two or more magnets on its own tile side during a bonding event. In some embodiments, a minimum of two magnets may be used during a bonding event. In some embodiments, four magnets may be used during a bonding event. Thus, in some embodiments the measured magnetic field may be considered to be a "magnetic field of a given detected state," rather than of a particular magnet (i.e., the measured magnetic field may be from a combination of magnets).

In this case, the magnetic field sensor senses characteristics from a combination of several magnetic fields generated from different magnets which together form a signature. Because of this, instead of a level-setting technique, in one or more embodiments the aforementioned "signature" technique may prove more beneficial for some applications.

In one embodiment, when the strength of the magnetic field of a given detected state is equal to or greater than a predetermined value threshold (indicative of a properly aligned bond with a complementary magnet on an adjacent tile), then controller 30 may determine that an assembly error has not occurred with respect to the other tile for that side. On the other hand, when the strength of the magnetic field of the detected state is below a predetermined value, the controller 30 may detect or indicate that an assembly error has occurred with respect to that side of the smart tile.

The aforementioned technique is a level-based thresholding technique (e.g., based on a magnetic field strength value or level, as opposed to a more complex signature-based indication provided, for example, with values in two- or three-dimensional space) for detecting bonding and alignment errors during assembly. A different technique may be used in another embodiment, such as a signature-based technique.

In a signature-based application, the magnetic field sensor may output information indicative of a magnetic signature (e.g., the magnetic field strength and polarity that is sensed is particular to the baseline calibration of that sensor, and the very particular spatial magnetic field arrangements of various predetermined "detected scenarios". These predetermined detected scenarios may include, but are not limited to a) baseline sensing with no neighbor, b) sensing a neighbor during bonding approach, c) sensing a completed good bond with a neighbor, d) sensing a meta-stable (bad) bond with a neighbor and e) sensing an inverted (bad) bond with a neighbor.

The controller 30 may compare the signature to a predetermined signature indicative of a proper magnetic bond and/or an aligned bond respecting a proper magnet pairing on a corresponding side surface of the tile. When the magnetic field sensor signature matches the predetermined signature at least to within a predetermined tolerance, the controller 30 may determine that no assembly error has occurred, e.g., that a properly aligned magnetic bond exists. When the magnetic field sensor signature deviates from the predetermined signature, the controller may determine that an assembly error exists, e.g., there is an improperly aligned magnetic bond.

The assembly error (or improperly aligned magnetic bond) to be detected may include a partial bond where, for example, one electromagnet on a side surface is properly bonded but no bond or a weak bond exists relative to the other magnet on the same side surface. In such a case, an out-of-plane metastable bond may be determined to have occurred, e.g., as shown in FIG. 2. An out-of-plane meta-stable bond may include one where one tile is, for example, rotated by an angle (e.g., ~90 degree turned) relative to another tile to which it is to be bonded. Such a case may occur, for example, when the other magnet and the complementary electromagnet on the other smart tile have different spatial coordinates.

Referring now to FIG. 3, shown is another example of an out-of-plane bond. In this case, a first magnet on side surface 250 of smart tile 1 is properly bonded to the first magnet on tile 2. However, the second electromagnet on tile 2 is turned approximately 90° in a clockwise direction out-of-plane with the second electromagnet on side surface 250 of tile 1. In this case, the magnetic field sensor signature (or level) generated based on the sensed signals (e.g., voltage or current) output from sensors of tile 1 do not comport with the predetermined signature (or level) indicative of a properly aligned magnetic bond. The controller 30 may therefore detect an improper bond based on this discrepancy FIG. 4 is a conceptual diagram showing an example of another type of error that may occur during an attempt to generate an aligned magnetic bond between two tiles. In this case, the error is an inverted bond where the one side 410 of the smart tile 1 has a first arrangement of electromagnets 411 and 412, shown in an exploded view relative to the tiles. These electromagnets are magnetically bonded to electromagnets 421 and 422 of the side 420 of tile 2. (While respective pairs of bonded electromagnets 411/421 and 412/422 would contact one another in an actual case, for clarity and conceptual understanding the circles corresponding to the electromagnets are separated).

Moreover, in the conceptual diagram of FIG. 4, a number is associated with each electromagnet. Electromagnets 411 and 412 have numbers 0 and 1 associated with them respectively. A proper alignment and magnetic bond to side 410 would have numbers 0 and 1 of electromagnets 421 and 422 similarly aligned, e.g., 0 to 0 and 1 to 1. However, the inverse is the case here, e.g., the value of 1 of side 420 corresponds to the value of 0 of side 410, and the value of 0 of side 420 corresponds to the value of 1 of side 410. This indicates that tile 2 having side 420 is upside down (or inverted) and thus misaligned 180° relative to side 410 of smart tile 1.

In some cases, it is possible the magnetic field sensor signature (or level) produced by the inverted aligned magnetic bond of FIG. 4 would produce the same (or substantially the same) magnetic field sensor signature (or level) produced by a properly aligned magnetic bond. In this case, the physical planes of the side surfaces may substantially match (and ideally, exactly match) to produce a magnetic field sensor signature (or level) that matches a properly aligned and bonded signature.

To prevent such an inverted bond from occurring, each side surface of the smart tile may include an alignment guide which allows the side surface to properly assemble with the side surface of another tile 2 when the tiles are in proper alignment, e.g., are in a non-inverted proper position. The alignment guide may also be structured to prevent proper assembly of the side surfaces of tiles 1 and 2 when an inverted bond exists, e.g., to prevent the physical planes of the side surfaces of the adjacent tiles (and thus the magnets) from being aligned sufficiently enough to produce a magnetic field sensor signature that matches a properly aligned and bonded signature, thereby removing the ambiguity.

Figure 5A:
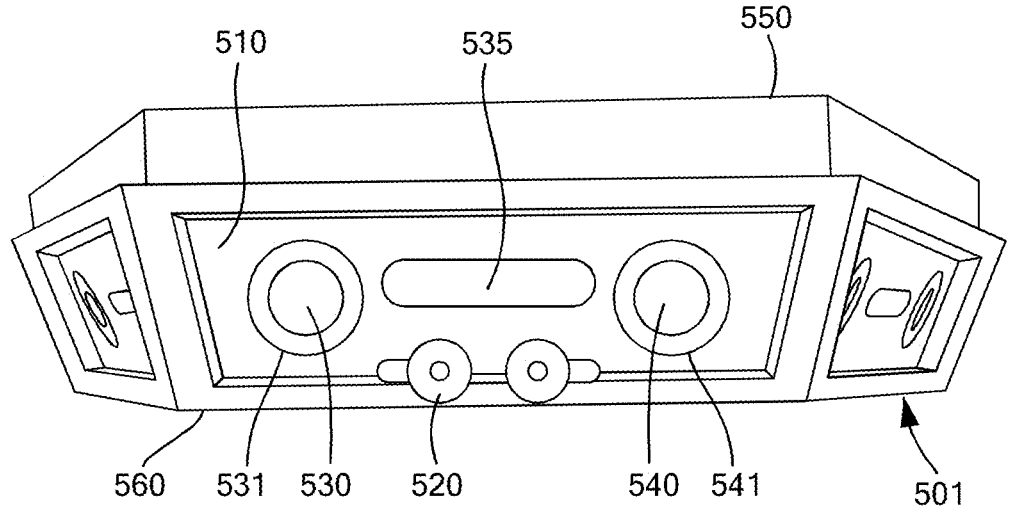
FIG. 5A is a side view of an example of an assembled tile.
Figure 5B:
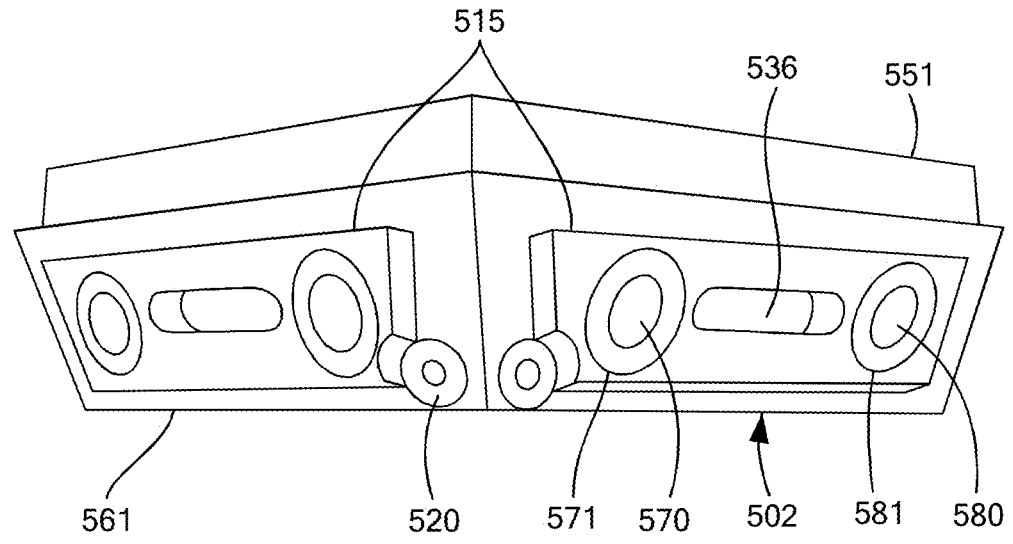
FIG. 5B is a side view of an example of an assembled tile.

FIGS. 5A and 5B are diagrams showing examples of alignment guides that may be included on outer side surfaces of each smart tile to be assembled together. The alignment guides may aid in proper bonding and prevent at least some types of improper bonds. For example, the alignment guides may cause two tiles to be offset from one another to prevent the formation of an inverted bond, which would otherwise produce a magnetic field sensor signature indicating a proper (e.g., aligned or good) bond. The offset produced by the alignment guides in this case may cause a magnetic field sensor signature (or level) indicating that an assembly error (or bonding error) has occurred between the tiles.

In one embodiment, the alignment guide of one tile 501 may include a recess 510 located on along the side surface and the alignment guide of another tile 502 may include a complementary chiral protrusion 515 which is configured to be inserted into the recess 510 of tile 501. In this non-limiting example, the protrusion 515 and recess 510 have complementary trapezoidal shapes, and tile 501 has a hexagonal shell shape and tile 502 has a pentagonal shell shape. When the chiral protrusion 515 is drawn into the recess 510 by attractive forces of the magnets, the two tiles may be bonded together. More specifically, in this example, the chiral protrusion may fit into a complementary recess along the edge of the side surface of another tile to which the smart tile is to be assembled. When the tiles to be assembled are oriented in an inverted configuration (e.g., inverted bond), the protrusion on the smart tile and the recess on the other tile do not mate (e.g., the protrusion does not properly fit into the recess). This creates an offset between the magnets of the two tiles that prevents an inverted bond from forming. This improper bond may be detected by a resulting deviation of the magnetic field sensor signature.

Figure 5C:
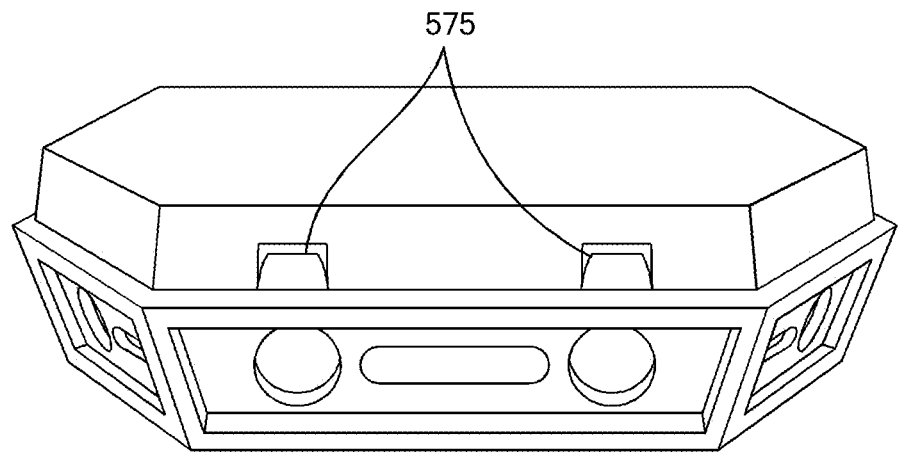
FIG. 5C is a side view of an example of an assembled tile.
Figure 5D:
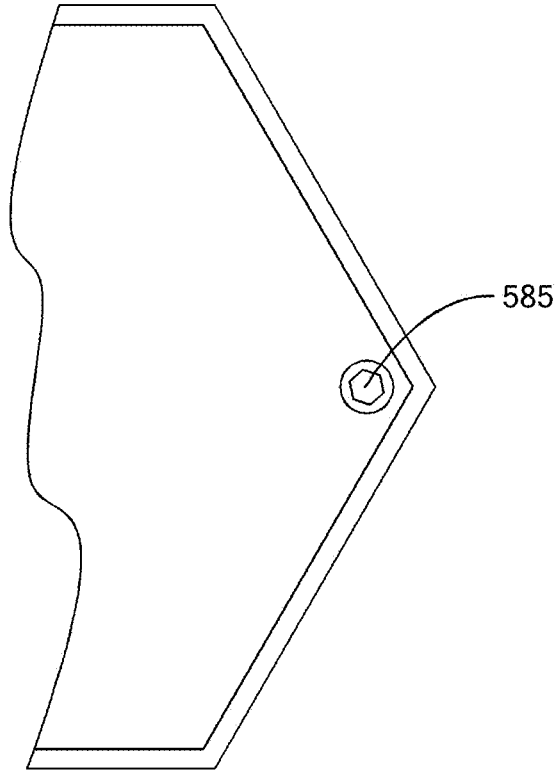
FIG. 5D is an exploded side view of an example of a tile.

In the embodiments of FIGS. 5A and 5B, smart tile 501 includes two electromagnets 530 and 540 on each side surface and smart tile 502 includes two electromagnets 570 and 580 to be bonded to respective ones of electromagnets 530 and 540. The electromagnets may extend through corresponding holes 531/541 and 571/581 in the shells of the tiles. In this embodiment, the top surface 550 and 551 of the shells of the tiles may be removably attached (e.g., by latches, clasps, screws and/or other types of fasteners) to bases 560 and 561 including their bottom surfaces. A configuration where the top surface 550 of the shell of tile 501 is removably attached to the base 560 using clasps 575 is shown in FIG. 5C. A configuration where top surface 550 is removably attached to the base 560 using one or more screws 585 is shown in FIG. 5D.

Several additional features of the smart tile are also shown in FIG. 5A. For example, one or more side surfaces of smart tile 501 and 502 may respectively include slots 535 and 536 which allows signals to pass which may serve as a basis for allowing communications to take place between adjacent tiles. The communications may, for example, include determining the status of magnetic bonds between the smart tile and an adjacent tile. In one embodiment, the communication signals may be optical signals which indicate bond status based on a color sensing operation or receipt of a modulated data signal sent from one tile to another. The communication signals may be considered to be confirmation or bond status signals.

In another embodiment, the confirmation or status signals may be derived from one or a series of coded pulses wirelessly (e.g., optically or magnetically) transmitted from one tile to another tile to which it is to be bonded. One form of wireless transmission of data is AC magnetic coupling, an example of which includes a near-field communication (NFC) application. For example, when the magnets of adjacent tiles include coils, the coil of around the magnet of one tile may transmit data to the coil around the magnet of another tile to which it is coupled. The coils of the coupled magnets may operate as loop antennas, effectively forming an air-core transformer. One example may be shown in FIG. 4, where the coil of magnet 411 transmit information that is received by the coil of the magnet 421.

The data may be transmitted in various forms using various protocols and/or modulation techniques. In one embodiment, coded pulses or other types of signals containing data may be generated and transmitted for interpretation by the receiving tile controller. The data may include information indicative of bond status, proximity, and/or other types of information. In embodiments that use a magnetic field sensor for detecting alignment, the magnetic field can be similarly modulated or switched on and off to signal the identity of each bonding location to the proximate segment. Other types of wireless communications between coupled coils (e.g., different from NFC) may also be performed for transmitting data. In order to support these embodiments, the controller of each tile may be coupled to its coil magnets to generate and transmit the data through the coils and also to receive data transmitted through the coils of other tiles to which they are coupled. In some applications, solid-state sensors may be included in the tiles for wireless transmission and reception of data between the coils of bonded magnets.

Figure 6:
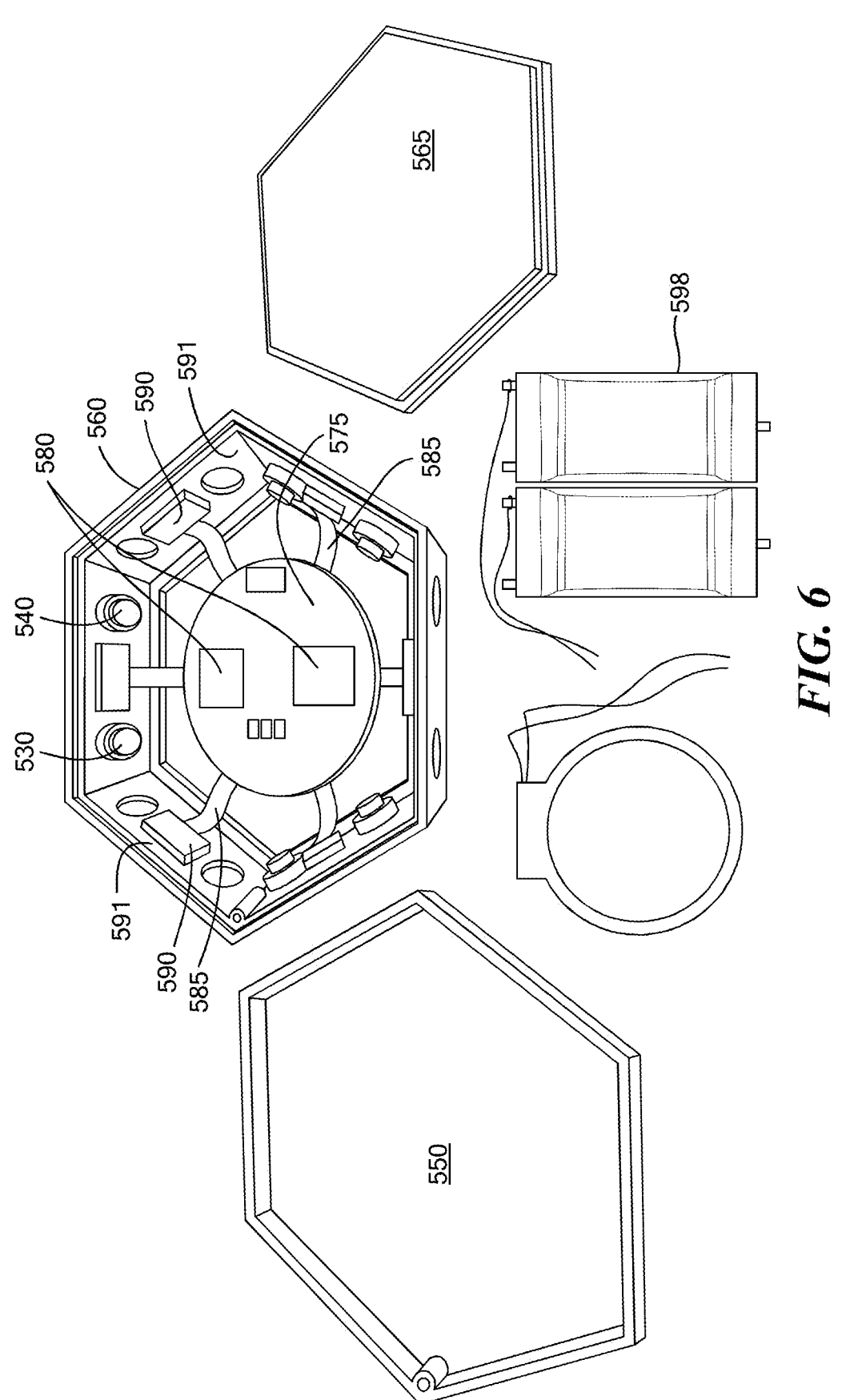
FIG. 6 is a perspective view of a disassembled embodiment of a smart tile.

FIG. 6 is a diagram showing an embodiment of a disassembled view of the shell of the smart tile 1 shown in FIG. 5A. In this diagram, the top surface 550 includes one hole 541 for allowing screw 580 to fasten the top surface to the base 560. The bottom surface 565 of the base is also shown, which may be removably attached to the base by friction fit or a fastener. The base includes a printed circuit board 575 that includes various circuits and chips 580 corresponding to the controller 30, one or more storage areas for storing instructions and data, and various other electronic components as described herein.

The base 560 has a hexagonal shape in this embodiment. Accordingly, six sets of signal lines are 585 may be coupled between the printed circuit board and respective sides of the shell. The signals lines may couple the electromagnets 530 and 540 to power under control of the controller 30 corresponding to circuits and chips 580. The signal lines may also couple the controller 30 to one or more magnetic field sensor(s) and proximity sensors 590 held to the inner surface 591 of each side of the shell. In addition to these features, the shell may include a battery system for providing power to the electronic components of the tile. In this example, this case includes a hard-shell lithium ion battery pack. A supplemental power source in the form of one or more supercapacitors 598 may also be included in the shell. The supercapacitors may be housed, for example, at a position above the printed circuit board 575 within the shell.

Figure 7A:
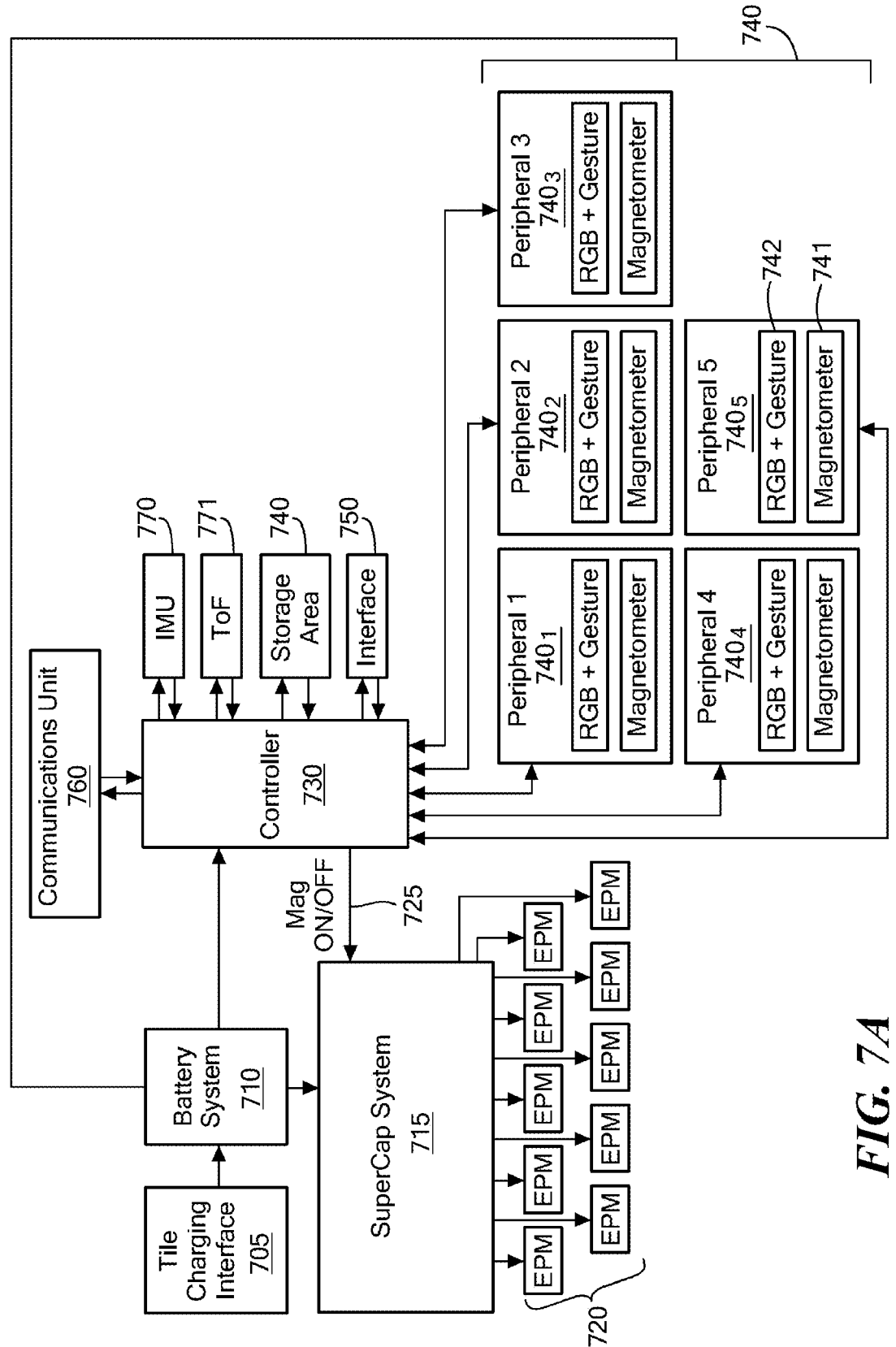
FIG. 7A is a block diagram of an embodiment of a smart tile.
Figure 7B:
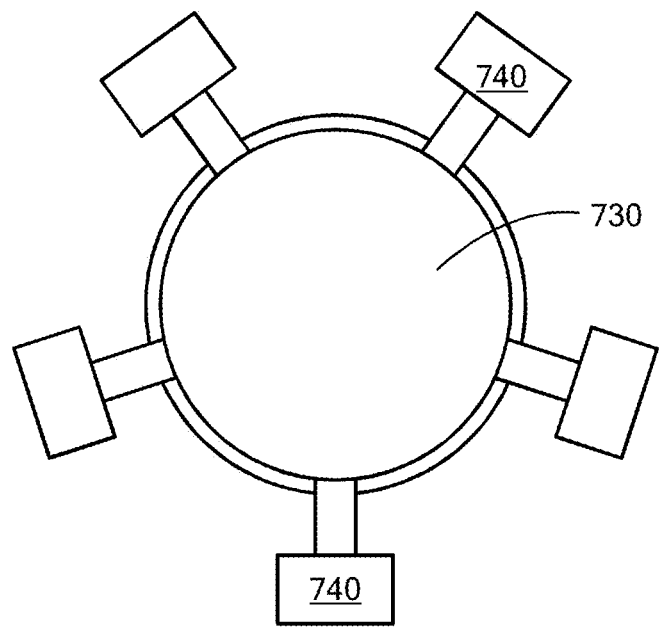
FIG. 7B is a top view of a smart tile with peripheral devices coupled thereto.

FIG. 7A is a block diagram showing an embodiment of a smart tile 700 having a shell which includes a battery system 710, electromagnets 720, a controller 730, and a plurality of peripheral modules on the tile side faces 740. In this embodiment, the shell of the smart tile has a pentagonal configuration with ten electromagnets on each side surface. An example of the internal electronic components of the pentagonal shell is shown in FIG. 7B. A hexagonal (or other geometrical configuration) of the shell may be similar to the configuration of smart tile 700 but, for example, with an extra pair of electromagnets for the sixth side surface with an extra corresponding peripheral module.

The battery system 710 provides power for the smart tile and, for example, may include one or more rechargeable batteries such as the lithium ion battery pack as described above. In one embodiment, the battery system may include a hard-case lithium-ion battery with one or more supercapacitors arranged in a series or parallel configuration. In one embodiment, the lithium-ion may be a 3.3 V 400 mAh battery and the supercapacitors may be 1.2 F each. In other embodiments, the battery and supercapacitors may have other power parameters to meet, for example, the scale and/or intended application of the smart tiles in forming the finished assembled structure.

The battery system 710 may also include one or more protection circuits (e.g., an over-charging, over-discharging, and/or short-circuit protection circuit), a power distribution load switch, and a DC-DC boost converter (e.g., up from 3.3 V to 8.3V for EPM actuation). In addition, the battery system 710 may be coupled to receive charging power through a tile charging interface 705, which, for example, may be electrically connected to the battery charging pads previously discussed. Additionally, or alternatively, the battery system 710 may receive power from one or more other power sources, e.g., one or more solar panels coupled to the shell.

The magnets 720 may be provided in a predetermined an arrangement on each side surface of the shell. In the example of FIG. 1, the shell has the shape of a hexagon but in the example of FIG. 6 the shell has a pentagonal shape, and therefore five pairs of magnets 720 are shown. However, a different number of magnets may be used in another embodiment. Moreover, the same number and arrangement of magnets may be provided on each side surface of the smart tile, or one or more of the side surfaces may have a different arrangement. Power from the battery system 710 may be provided to the controller, magnets, and other circuits, and/or the supercapacitors 715 may be used to actuate the magnets in active or passive applications. In one embodiment, the supercapacitors may be used to power the electromagnets to create a repulsion force to separate two tiles.

The magnets 720 may be switched electro-permanent magnets (EPMs), each of which includes a coil wrapped around a permanent magnet core. The core may be made, for example, of neodymium, samarium-cobalt, steel, or another material. In a passive application, the magnetic field generated by the core may generate a force sufficient to attract and bond to the magnets of another tile, without application of power to the coil. The coils may be made, for example, from copper wire. In an active application, additional magnetic field strength may be generated by applying electrical current through the coil to attract and bond to the magnets of another tile.

To create a repulsive force to separate two tiles which have been improperly assembled (e.g., which have an improper magnetic bond), the controller may control one or more of the superconductors 715 to apply a pulse of electrical current through the coil to temporarily overcome the magnet field from the permanent magnet, e.g., the pulse of electrical current may generate a repulsive force greater than the attractive force of the magnetic core and is of sufficient strength to separate the magnetic bond between the adjacent tiles. In one embodiment, sufficiently low currents may be applied such that the magnetic field returns to its original value after the current is removed from the coils. Structurally, each electro-permanent magnet may have a cylindrical package with specific dimensions and magnetic cores of a predetermined diameter. The electro-permanent magnets 720 may be different from EPMs in another embodiment.

In one model embodiment, the electromagnetic package may have a 5-10 mm diameter with a permanent magnet core of 3 mm. In this case, the modeled electromagnet may provide magnetic field readings between two EPMs. These values may be scaled to match, for example, an application of smart tiles that have different sizes, and even sizes that are sufficient to serve various space-related applications or human habitats on planets or orbiting positions.

The controller 730 controls operations of the smart tile. In one embodiment, the controller 730 may trigger operation of the supercapacitors based on a control signal 725 (Mag ON/OFF) during an assembly, disassembly, reassembly, and/or bond correction operation. To perform a disassembly or bond correction operation, the control signal 725 may have an ON state to send power to the coils of the electromagnets and generate a separating repulsive force as described above. Otherwise, the control signal 725 may have an OFF state to save power. In one embodiment, the controller 730 may selectively control the ON/OFF states of a plurality of control signals used to actuate respective ones (or pairs) of electromagnets on respective side surfaces of the tile. For example, if all side surface of the tile but one have proper bonds but the remaining side surface has an improper bond, the controller 730 may selectively generate a control signal 735 to actuate the electromagnets on the side having the improper bond.

Thus, in one embodiment, the controller 730 may selectively control active repulsion of the electromagnets, rather than strictly neutralizing the magnetic field. This may be accomplished, for example, by designing each electromagnet 720 to use a distinct North and South pole, so that a single unit can be used in all joints, while still achieving the NN/SS and SN/NS polarity maps for assembly. In a space application, an extensible platform may be provided that can also be used to design macro-scale EPMs that will ultimately be used in orbit for a life-size assembled structure.

In one embodiment, the controller 730 may power the coils of the electro-permanent magnets with a predetermined voltage $V_{MAG}$ (e.g., 8.3V) post-boost, targeting 5.85V and 4.5 A through the coils. These are only examples and different values may be used in other embodiments. Irrespective of the specific values, the baseline, unpowered magnetic strength of the electro-permanent magnets may provide sufficient attractive force to attract and maintain a magnetic bond after proper assembly, and when powered, to provide a sufficient repulsive force to break each electro-permanent magnet from a magnetic bond with a paired magnet of another tile when, for example, an assembly error is detected and/or the tiles are to be reconfigured in another structure or to be stowed for future use or transport.

The controller 730 may control operations of the smart tile based on instructions and data received from various sources. The instructions may be stored, for example, in a storage area 740, which, for example, may include a micro SD card, an on-chip memory, and/or an internal memory of the controller. Storage area 740 may also store various types of data processed or received by the controller during operation. The data, command, or instructions to be stored may be received, for example, through an interface 750 (e.g., a micro USB interface) and/or a communications unit 760. The instructions may be used, for example, to programming the controller to perform operations of the smart tile.

Orientation of the smart tile may be determined, for example, based on data received by one or more sensors. The sensors may include an inertial measurement unit (IMU) 770 which may provide an indication of the orientation of the smart tile as it floats in the microgravity environment. IMU data shared across two or more tiles can be used to determine whether the motion of tiles is linked as a single, bonded mass, and thus the IMU data can be used as part of the state-machine logic for determining whether a good bond has been met and held between tiles. Magnetic trackers are also established and well known in the art for determining the range and angle between multiple objects— by quickly modulating or switching polarities of the tile's electromagnets in a predetermined sequence and receiving induced currents on the magnetic field sensors of the other tiles, relative tile location and orientation can be also derived. Similarly, optical tracking of modulated light sources on the tiles and/or image recognition can also determine or aid in determining relative tile orientations and translations, as is likewise well known in the art and often used in docking operation.

The peripheral modules 740 are housed within the shell of the smart tile and may correspond in number to electromagnet arrangements respective side surfaces of the tile. Because the tile has a pentagonal shape in the example of FIGS. 7A and 7B, five peripheral modules $740_1$ to $740_5$ are shown. Each of the peripheral modules may include a magnetic field sensor 741 and one or more additional sensors 742. The magnetic field sensor senses a signal level or signature from a corresponding arrangement of electromagnets on each face of the tile. As described herein, the signal level or signature may indicate whether an assembly error exists with respect to magnetic bonds of the corresponding electromagnets.

The one or more additional sensors may include light sensor, a proximity sensor, and/or a gesture sensor. In one embodiment (described in greater detail below), the light sensor includes a light emitter and a light receiver that respectively transmit and sense one or more colors of light (e.g., red, green, blue (RGB)) for performing a handshaking protocol to confirm bonding status between tiles—rather than (or in addition to) using a RGB LED, this can also be accomplished by modulating each LED with a coded transmission that is detected by the light sensor. In one embodiment, the proximity sensor may determine whether the second tile is within range and in proper alignment with the first tile. The proximity sensor may be, for example, a Time of Flight (TOF) sensor or a camera.

Another feature of the tiles may include one or more charging pads 520 (e.g., see FIG. 5A) located on one or more side surfaces of the smart tile. The charging pad(s) may be used in charging a battery housed within the tile shell. The internal battery system (supplemented in some cases with supercapacitors as explained below) may be used to power the controller 30, the magnetic field sensor, electromagnets 20 and other electrical features of the tile.

The communications unit 760 may receive commands from and/or exchange data with a host system (e.g., a base station or other control system). The host system commands may include, for example, an initiation command which is used by the controller 730 as a basis for triggering tile assembly. The communications unit may also transmit to the host system data which, for example, may be stored in the storage areas of the tile. The data may include status information indicative of whether or not properly aligned magnetic bonds have been established on each side of the smart tile. The data may also include state of battery charge information, inertial and/or telemetry data, orbital and/or orientation data, magnetic field sensor signature information, error or malfunction information and/or any other information associated with operation of the smart tile. The communications unit 760 may send and receive information on one or more frequencies of a predetermined band. The frequencies may be included, for example, in a short range band such as a Bluetooth or WiFi range, an radio frequency (RF) band of a type used for satellite communications, or in another frequency range.

The controller 730 and its associated features may be used to implement a method for controlling operation of the smart tile. The control method may be based on various control algorithms. One example of such a control algorithm implements a Bang-Bang control paradigm, where each smart tile to be used in forming the assembled structure is switched between various discrete states based on a state machine, with sensor data inputs driving the logic for the switching. This may also be referred to as a form of Hysteresis Control, due to the known dependence on the response gap timing between two states that cannot, in all circumstances, be instantaneously switched. In one embodiment, the switching logic may be expressed by Equation 1.

$$\alpha^*(t) = \begin{cases} 1 & \text{if } 0 \le t \le t^* \\ 0 & \text{if } t^* < t \le T \end{cases} \tag{1}$$

Where $\alpha(t)$ is the aspirational optimal control with switching execution occurring at elapsed time $t^*$. After a $t=2$-$3$ second nominal EPM pulse and after the $t^*$ switch completes, the EPMs may remain in an OFF configuration through buffering time in the state machine (e.g., to avoid rapid re-firing of the EPMs in the case of a persistent trigger that causes overheating and battery depletion) until a newly sensed event triggers the issuance of a subsequent pulse.

Figure 8:
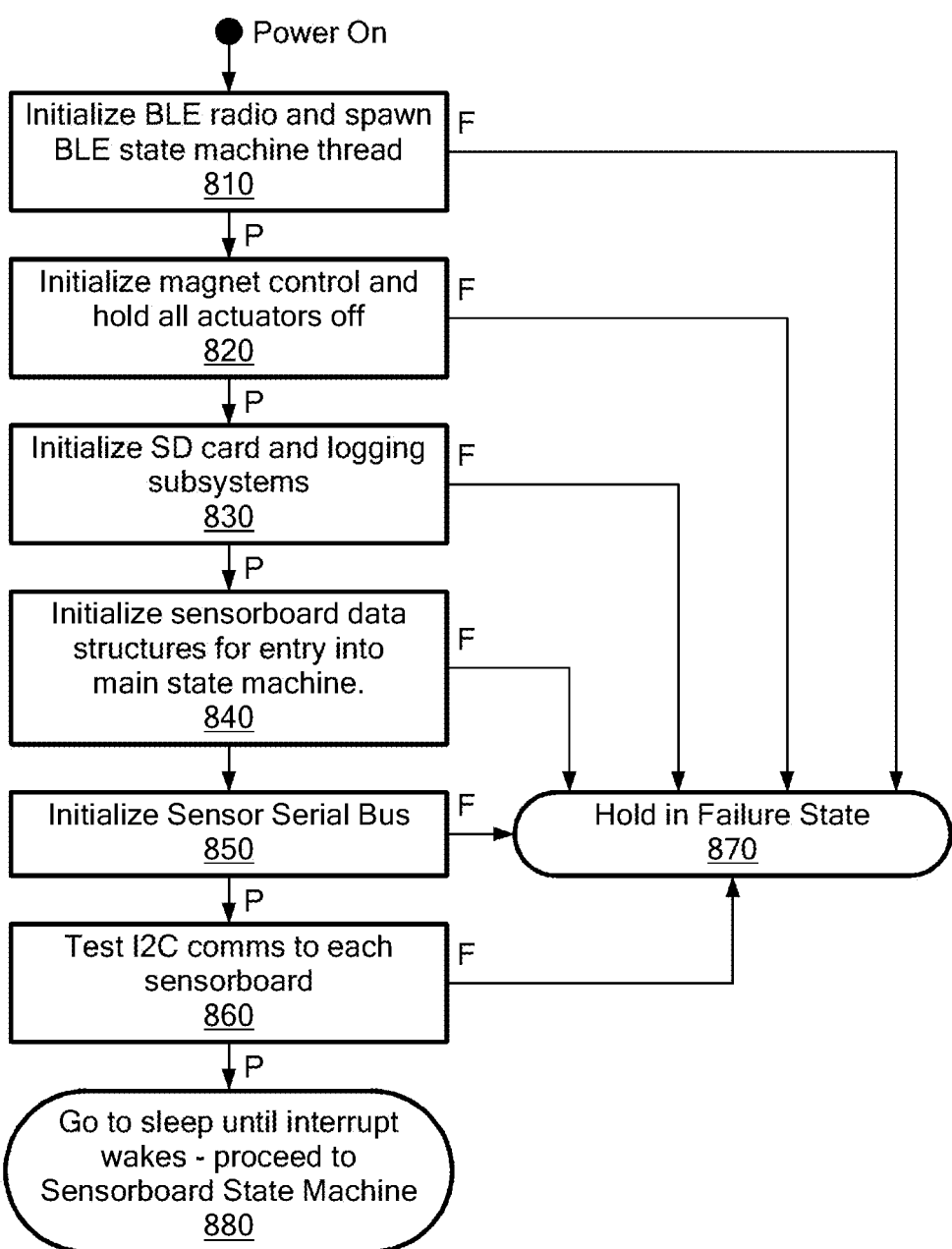
FIG. 8 is a state diagram of an embodiment of smart tile initialization operations.

FIG. 8 is a flow diagram showing operations included in one embodiment of a method for initializing a smart tile using a state machine. The smart tile may be any of the embodiments of the smart tile described herein.

Referring to FIG. 8, the method includes, at 810, initializing the communication unit and spawn a communication unit state machine thread after power on. At 820, electromagnet control may be initialized and all actuators may be held in an OFF state. At 830, the storage area (e.g., SD card) may be initialized and subsystems may be logged in for operation. At 840, sensorboard data structures may be initialized for entry into a main state machine. The sensorboard may correspond to the printed circuit board 575, the peripheral circuits 740, and/or any of the other electronic components of the tile. At 850, a sensor serial bus of the smart tile may be initialized. At 860, I²C communications to each sensorboard may be tested. The controller 730 may perform all or a portion of these operations.

If all of these initialization and testing procedures are not successfully completed (e.g., as determined by internal checks of the controller), the smart tile may be held in a failure state at 870 and the controller may transmit an error signal, for example, to a host system through the communications unit 760. Otherwise, at 880, the smart tile may enter a ready or sleep state or may proceed directly to performing an assembly operation. The sleep state may continue, for example, until an interrupt signal is received by the communications unit 769 to "wake up" the smart tile to perform a designated operation, in which case the sensorboard state machine may be executed for control.

Figure 9:
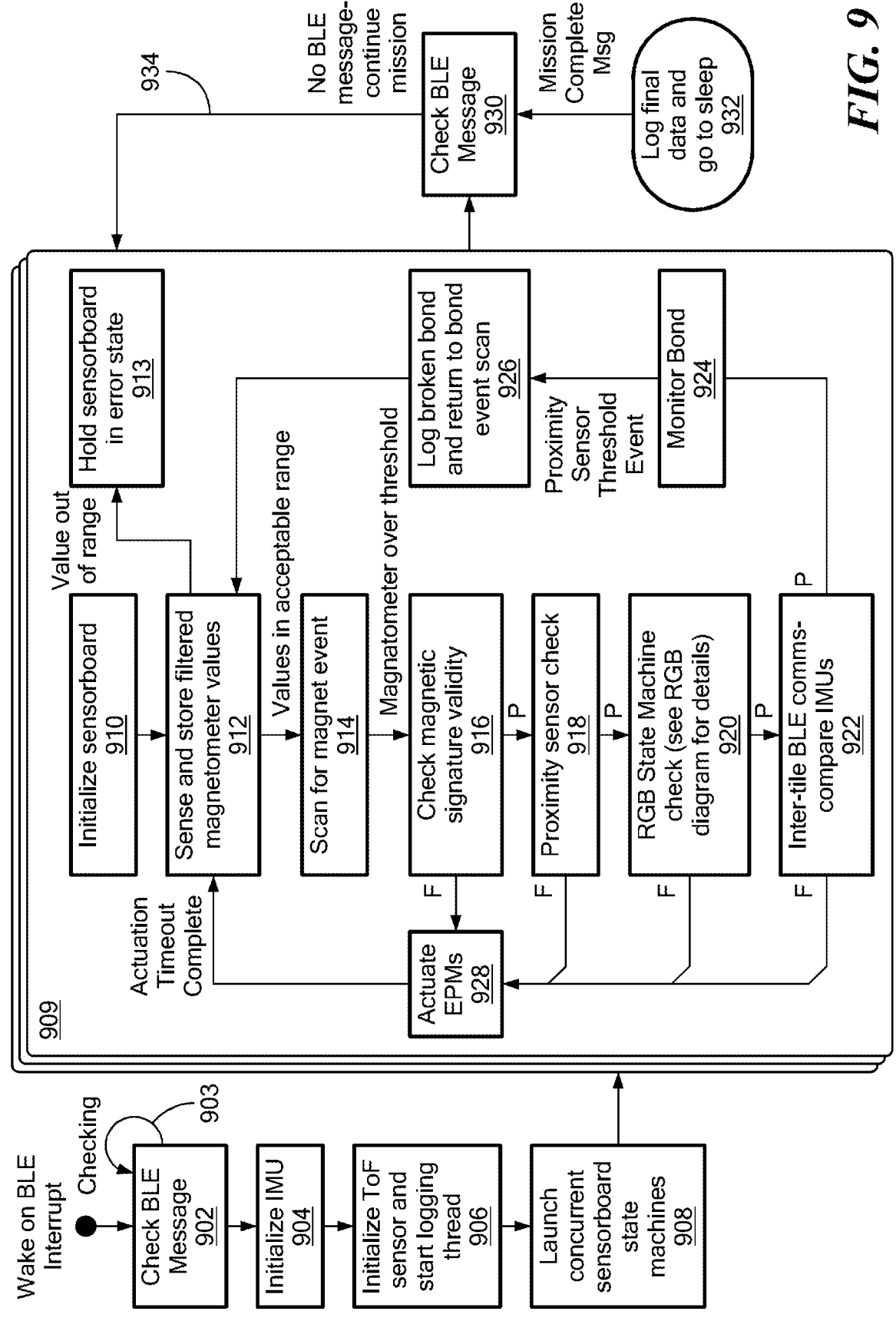
FIG. 9 is a state diagram of an embodiment of operations used to assemble adjacent smart tiles and to detect and correct a magnetic bond error between the tiles.

FIG. 9 is a flow diagram showing operations included in one embodiment of a method for controlling an assembly operation and EPM actuation using another state machine. In this embodiment, EPM actuation may be used to perform self-assembly error control and correction when the tile has formed an incorrect or meta-stable bond with another tile. The state machine is to progress through a series of sensor checks to diagnose a bond event and then either place that bond in a supervisory monitoring state (if assessed as a properly aligned bond, e.g., a "good bond") or actively separate the tiles via pulsing one or more of the EPMs (if assessed as corresponding to an assembly error, e.g., a "bad bond").

Referring to FIG. 9, at 902, the controller receives a wake-up or interrupt message through the communications unit. If the message includes a mission start command (e.g., Mission Start Msg), then, at 904, the controller initializes the inertial measurement unit (IMU). If the wake-up message includes a different command, then the controller proceeds accordingly through path 903, which, for example, may involve transmitting a responsive message to the host system and/or taking additional action as programmed.

Figure 11:
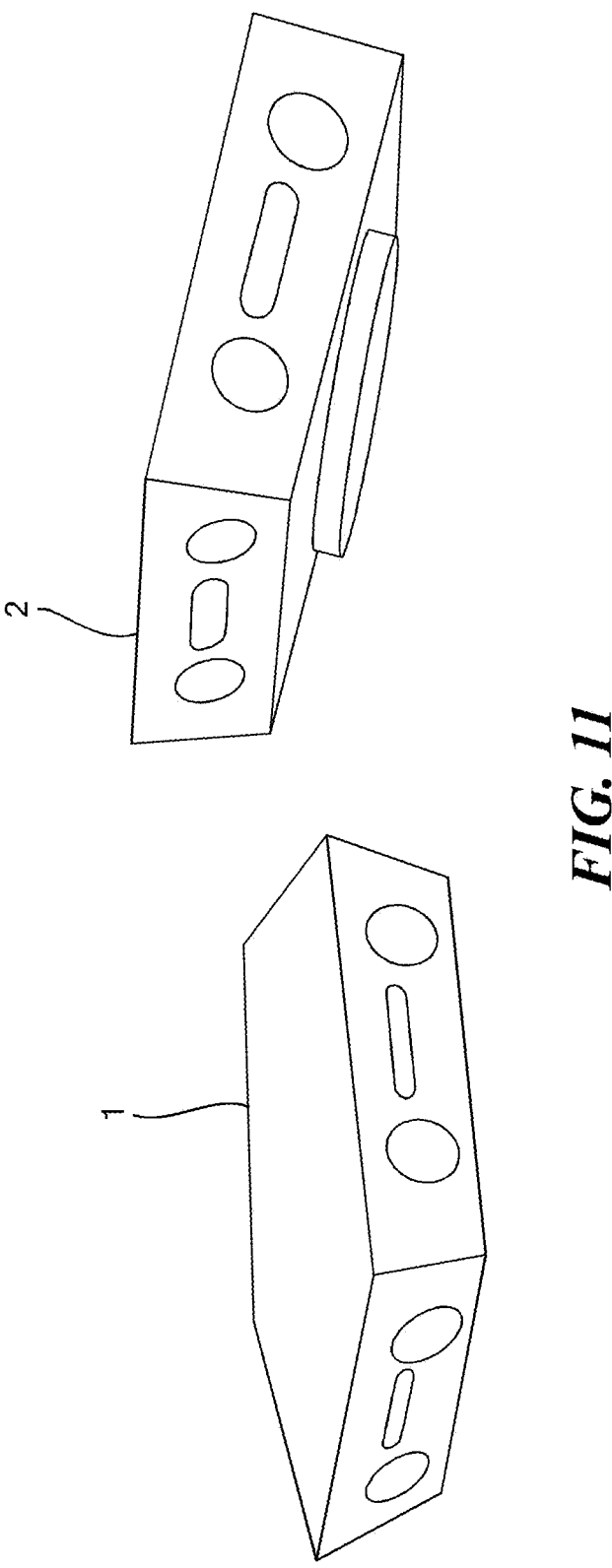
FIG. 11 is a diagram showing an example of floating smart tiles in a microgravity environment.

At 906, the controller initializes a proximity sensor and starts logging a thread. In embodiment, the proximity sensor may be provided as a Time of Flight (ToF) sensor (e.g., ToF 771 in FIG. 7A). The proximity sensor may measure or otherwise determine a distance between the smart tile (e.g. a first smart tile) and another smart tile (e.g. a second smart tile floating, moving toward or otherwise approaching the first smart tile) prior to assembly. An example of smart tile 2 floating, moving towards or otherwise approaching smart tile 1 is shown in FIG. 11. In embodiments in which the proximity sensor is a ToF sensor, the distance may be determined based on the time difference between the emission of a signal from a ToF transmitter on the tile and its return to the sensor, after being reflected by the other tile. Once the distance is determined to be in a certain range, the controller may perform an assembly operation. As noted above, proximity sensors may be implemented in other fashions as well (e.g., AC or pulsed magnetic trackers, etc.) as is standard in the art.

At 908, controller 730 may implement a separate state machine for controlling an autonomous self-assembly operation of the magnets on a respective one of the side surfaces of the smart tile. In one embodiment, the arrangement of magnets on a first side surface of the smart tile may be controlled by a first sensorboard state machine, the arrangement of electromagnets on a second side surface of the smart tile may be controlled by a second sensorboard statement machine, and so on. In one embodiment, the sensorboard state machines for the arrangements of electromagnets on all side surfaces of the smart tile may be similarly configured and concurrently launched.

In another embodiment, the sensorboard state machine for an arrangement of electromagnets on at least one side surface may be different from the sensorboard state machines for the other side surfaces, e.g., when the arrangement, number, or configuration of those electromagnets is different from other arrangements. A description of operations performed for each of the sensorboard state machines will now be described in area 909 in accordance with one embodiment.

At 910, the sensorboard is initialized. This may include loading initial values of data including, but not limited to, predetermined and threshold values for ensuring proper operation according to the state diagrams described herein, clearing out buffers of previously stored or erroneous value, and placing the circuits in predetermined states for performing communication, assembly, and/or other operations.

At 912, magnetic field sensor values for the magnets are sensed and stored. The values may be filtered prior to storing to suppress noise and/or other effects. Additionally, or alternatively, the filtering may be performed to acquire magnetic field sensor values that are in one or more predetermined (e.g., acceptable) ranges.

At 914, the magnetic field sensor values are then scanned by the controller to determine whether a magnet event has occurred. For example, as another tile approaches the smart tile (which may be sensed by the ToF sensor), the magnetometer may detect the magnetic field from the magnet(s) of an incoming smart tile. (An example of the other tile 2 approaching the smart tile 1 in a microgravity environment is shown in FIG. 11.) This may allow the controller to trigger a magnet event.

In one embodiment, a magnet event may be determined to have occurred if the level of the magnetic field sensor signature exceeds a threshold value, e.g., if a magnetic field sensor overthreshold is detected. In this case, the electromagnets may mate with one or more magnets of the other tile, which, for example, may be determined based on detection of the magnetic field sensor overthreshold or triggering of the magnet event. If a magnet event has not occurred, scanning may continue until an overthreshold condition is detected or the process is otherwise terminated as a result of the controller determining that a predetermined condition has been satisfied.

At 916, the controller determines whether or not the magnetic field sensor signature is valid for the one or more mated magnets. This may involve the controller determining whether a proper aligned ("good") bond has formed with the magnet of another smart tile or whether an assembly error (or "bad" bond) has occurred. Once mated, even slight differences in the planes defined by the magnets in two opposing tiles may yield distinguishable magnetometer signatures, allowing the controller to determine whether coplanar successful bonds or metastable unsuccessful bonds have occurred. Example of metastable bonds shown in FIGS. 2-4 as previously described.

In one embodiment, determination of the validity of the magnetic field sensor signature may include comparing the magnetic field sensor signature with a predetermined signature as previously described. If the detected signature deviates from the predetermined signature (indicative of a magnet event) by a predetermined amount or more, then the controller may determine that a bad bond has formed and the validity check fails (F). Conversely, if the detected signature and the predetermined "good bond" signature are consistent with each other (e.g., they match), then the controller may determine that a good bond has formed and the validity check passes (P). In one embodiment, a "good bond" signature may include one that does not have a magnetic bond error as described herein.

In some cases, magnetic field sensors may exhibit certain limitations or variations which may make them inconsistent from package to package. Thus, in one embodiment one or more thresholds (or signatures) may be set as a baseline for each magnetic field sensor that is specific to each smart tile (or for each magnetic field sensor in the tile) for purposes of allowing the controller to determine whether a good or bad magnetic bond has formed. The baseline data may be stored in the storage area (e.g., SD card), or on EEProm of the smart tile.

At 918, when the validity check passes, a proximity sensor check may be performed. A proximity sensor may be included, for example, in each of the peripheral circuits as previously described. The proximity check may involve checking proximity across sensor slots (e.g., 535 in FIG. 5A) in the smart tile.

At 920, when the proximity sensor check passes, a light color sensing state machine may be implemented as described below. This state machine may be implemented based on transmitting and detecting different colors of light (e.g., red, green, and blue light emitters (e.g., light emitting diodes)) through the slots (or light windows) 535 of adjacent smart tiles. The light emitters may be selectively activated by the controller in order to communicate with the controller of the other tile concerning the status of the bond. Accordingly, the smart tiles may also include a light detector located adjacent to the light emitters to receive the light emitted from the other tile indicative of its determined bonding status. Conversely, the light emitter may be modulated with a particular code to indicate the tile location and/or communicate any other data across tiles, potentially eliminating the need for the RGB LED and color detector.

For example, if the controller of the smart tile determines that a good bond has formed, then the controller may activate the green light emitter to notify the controller of the other tile of this status. If the controller determines that a bad bond has been formed, then controller may activate the red light emitter to notify the controller of the other tile of this status. The smart tile then receives emitted light from the other tile in like manner based on an independent determination of the bond may by the other tile controller. When both smart tiles subject to the bond receive the same color of light (e.g., one or more green light pulses or one or more red light pulses), then agreement is reached on the status of the bond as being good or bad. This cooperative handshaking process may serve as additional confirmation of the status of the bond. As mentioned above, this can also be accomplished by pulsing different codes via a monochromatic LED, as is standard in optical communication.

At 922, if the light color sensing state machine check passes, the controller may acquire data from the inertial measurement unit and compare that data with IMU data received (through the communications unit) from the other smart tile to which it is assembled. If the two IMU data matches (at least to within a given tolerance), then a properly aligned magnetic bond (e.g., both magnets are properly aligned and bonded to a respective pair of magnets on the other smart tile with no assembly error) may be confirmed. If the IMU data does not match, the confirmation check fails.

More specifically, the controller of the smart tile may complete a final check that their IMU sensors are reporting coordinated motion vectors, indicating a mate and synched tile motion. If the sensor readings from either tile fail to meet a condition in this logic tree, the state machine may redirect control to an EPM pulse event to separate the tiles. In one embodiment, a negotiation may be performed between the tiles to determine which tile will actuate separation, e.g., which tile will generate the repulsive force to break the bad bond.

In another embodiment, both tiles may implement the repulsive force. However, in some cases it may be beneficial to avoid simultaneous EPM repulsion activation by both tiles, as that means both sides switch their polarities with current actively pulsing through, which would create a stronger attractive force, rather than the intended flip of polarity on one side or the other. This aspect of the control algorithm provides an option for power saving, where only one tile need pulse off to correct a bad bond, thus collectively saving battery in a two-tile neighbor interaction. This can be ignored, however, to let both tiles pulse off (but at different times) if redundancy is desired to ensure a backup chance at separation. The IMU data check may be omitted in some embodiments.

At 924, once the controller has confirmed the properly aligned magnetic bond, the bond may continue to be monitored at least for a predetermined period.

At 926, the next phase of the state machine may then be implemented. If it is determined by the controller during the predetermined monitoring period (which may be a finite time or a time which continues even after completed assembly) that the bond has broken or become otherwise unacceptable, this event may be detected.

The controller may make this determination, for example, by determining that the magnetic field sensor signature has changed by a significant amount relative to the predetermined signature and/or the proximity sensor has determined a threshold even has occurred where the orientation of the tile has substantially changed relative to the orientation of the other tile (e.g., which may be received in the form of IMU data from the other tile, or ToF proximity data). If the controller determines that the bond has been broken, corresponding information may be logged into the storage area. If the magnetic field sensor signature indicates complete separation of the tiles, then the controller may return to scanning the magnetic field sensor values. If the controller determines (based on the magnetic field sensor signature and/or proximity sensor data) that some magnetic bond still exists, then an assembly error correction operation may be performed, for example, as explained below.

At 928, the assembly error correction operation may be performed to separately two improperly bonded tiles, in order to provide the opportunity of the tiles to properly bond again or to bond to other tiles. This error correction operation may be performed, for example, whenever a fail (F) has determined to occur in any of operations 914 to 920. When any of these fails happen, the controller may implement the assembly error correction operation by reversing the polarity of the magnet(s) to forcibly and intentionally break the bad magnetic bond. This may be accomplished, for example, by controlling the current to flow in the coils of the EPMs, to thereby create a repulsive force with sufficient strength to break the bad magnetic bond. The repulsive force may be created for a predetermined time (e.g., actuation time), after which the controller returns to reimplement the state machine starting from operation 910.

In alternative embodiments, current may be controlled to flow through the coils of an electro magnet to create an attractive force prior to scanning for a magnet event. In some cases, this may consume unnecessary power. Thus, in the foregoing embodiments, prior to scanning for a magnet event the electro-permanent magnets are not powered in order to allow a bond to be created based on the permanent magnetism of the EPM cores. In this case, power is applied to the electro-permanent magnet only to create the repulsive force necessary to break a bad bond. Such an embodiment actively saves battery power.

Once the operations of the state machine have been completed, the controller may implement a phase where, at 930, a check is performed to determine whether additional messages have been received from the host system. For example, the controller may wait to receive a mission (assembly) complete message indicating that all the tiles have been properly assembled and the structure has now been formed. In such a case, the controller of the smart tile may, at 932, log final data in its storage area and transition to a sleep state. If no mission-complete message has been received or a message has been received indicating a failure to form the structure, then, at 934, control may return to the stateboard state machine for additional assembly attempts.

Figure 10:
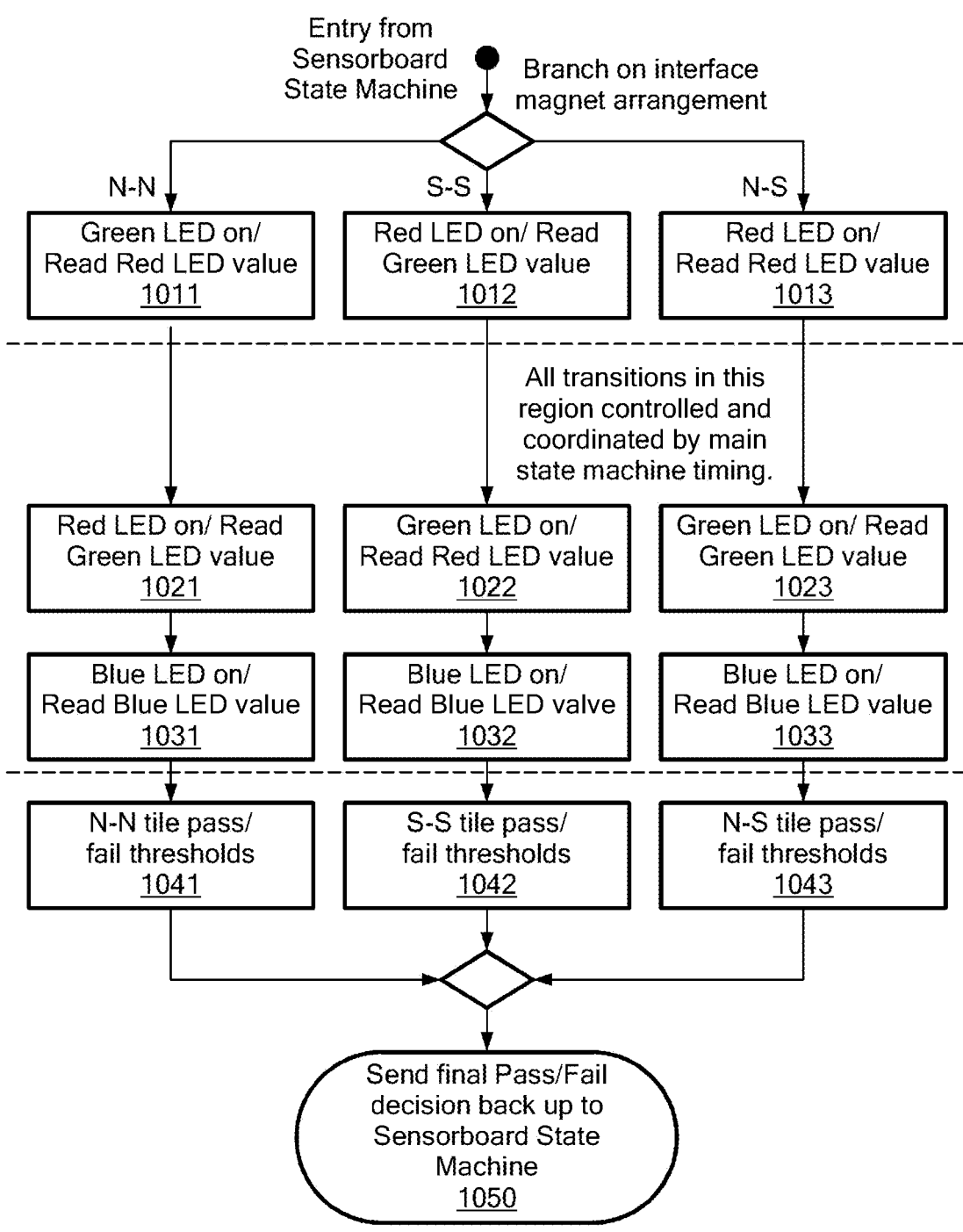
FIG. 10 is a state diagram of a light color sensing embodiment used to communicate and confirm magnetic bond status between two tiles.

FIG. 10 is a diagram corresponding to another embodiment of the light color sensing state machine which, for example, may be implemented by the controller using an RGB light emission and detection, proximity, and gesture circuit that performs digital RGB, ambient light, proximity and gesture sensing. One example of such a circuit is APDS-9960 from Avago Technologies. Such a circuit may be programmed or otherwise adapted to operate in accordance with the state machine of FIG. 10. The RGB and ambient light sensing feature detects light color emitted from another tile. Each of the colors are interpreted by the controller to indicate a certain bonding state (e.g., good, bad, etc.). In some embodiments, the circuit may also detect light intensity under various lighting conditions and through various attenuation materials including darkened glass. An integrated UV-IR blocking filter may enable accurate ambient light and correlated color temperature sensing. In another embodiment, a single LED can be modulated with appropriate data to signal a particular bonding location and transmit other information (e.g., bonding quality or other status/data) to the proximate or bonded tile.

The RGB and gesture circuit (e.g., APDS-9960) may also come equipped with a built-in proximity sensor that accompanies gesture sensing. For example, in one embodiment gesture detection may use a predetermined number (e.g., four) directional photodiodes to sense light reflected from another smart tile in order to determine and then convert physical motion information of the other smart tile (e.g., velocity, direction and distance) to digital information. For example, when another tile comes to within a predetermined proximity of the smart tile, the proximity sensor may detect its presence and automatically generate a signal for input into the controller along with the digital information. The controller may then activate operation of the magnets and/or perform other features as set forth in the state diagram previously discussed.

Use of a circuit as described above (e.g., APDS-9960) may have application of the smart tile to relatively smaller applications. In other embodiments, the smart tile may include a circuit (or suite of sensors) for performing RGB light emission and detection, proximity, and gesture sensing circuit that is more suitable for larger scale applications, e.g., on the order of meters or other distances and/or conditions for space applications. In other embodiments, an embedded camera can image the LEDs or fiducials or characteristics of other tiles and use standard computer vision techniques to gauge mutual tile position and angles.

Referring to FIG. 10, the state machine includes an initial state which transitions to one or more other states. In one embodiment of this state machine, red light may indicate a magnetic bond error (e.g., a "bad bond"), green light may indicate no magnetic bond error exists (e.g., (a "good bond"), and blue may indicate that a good bond, which was previously stable and being monitored, but has broken apart unexpectedly. In one embodiment, light pulses may be used to communicate messages along the state-machine bond diagnosis process. For example, one or more short pulses of red light, one or more short pulses of green light, etc., may communicate various types of messages, or data packets modulated on a single LED can indicate all of this status as well.

In the state-machine diagram, Pentagon N/N may indicate that all sides of a pentagon-shaped tile have two magnets, each with North outward facing polarities. Hexagon S/S may indicate that all sides of a hexagon-shaped tile have two magnets, each with South outward facing polarities. Hexagon N/S may indicate that three sides of the hexagon-shaped tile (e.g., every other side, alternating) have one south-outward-facing magnet and one north-outward-facing magnet. These sides bond to other hexagons. The three other sides have two south-outward-facing magnets that bond with pentagon-shaped tiles. These magnet polarities are associated with the baseline permanent core of the EPM and dictate which sides of which tiles are passively attracted to each other (no power, no current required).

In FIG. 10, three paths are shown. The first path corresponds to the Pentagon N/N configuration. During assembly, the controller of one tile performs a series of checks to determine whether the light from LEDs on the opposing tile conform to any of the depicted states. During a first check 1011, the green LED is on and Red light is read from the opposing tile indicating a magnetic bond error. During a second check 1021, the Red LED on the tile is on and a Green LED is detected from the opposing tile. If so, this means a magnetic bond error exists. During a third check 1031, the Blue LED is on and also Blue LED light is detected from the opposing tile. If so, this means a magnetic bond error exists.

If all checks pass, then the controller of the Pentagon N/N tile determines that there is no magnetic bond error for the two magnets on that side of the tile and generates a pass signal at 1041. If one or more checks fail, the controller of the tile generates a fail signal. A magnetic bond correction operation may then be performed, for example, in accordance with the embodiments described herein.

The second path corresponds to the Hexagon S/S configuration. During assembly, the controller of one tile performs a series of checks to determine whether the light from LEDs on the opposing tile conform to any of the depicted states. During a first check 1012, the Red LED is on and Green light is read from the opposing tile indicating a magnetic bond error. During a second check 1022, the Green LED on the tile is on and a Red LED is detected from the opposing tile. If so, this means a magnetic bond error exists. During a third check 1032, the Blue LED is on and also Blue LED light is detected from the opposing tile. If so, this means a magnetic bond error exists.

If all checks pass, then the controller of the tile may determine that no magnetic bond error on that side of the tile and a pass signal may be generated at 1042. If one or more checks fail, the controller of the tile generates a fail signal. In this case, a magnetic bond correction operation may be performed, for example, in accordance with the embodiments described herein.

The third path corresponds to the Hexagon N/S configuration. During assembly, the controller of one tile performs a series of checks to determine whether the light from LEDs on the opposing tile conform to any of the depicted states. During a first check 1013, the Red LED is on and Red light is read from the opposing tile indicating a magnetic bond error. During a second check 1023, the Green LED on the tile is on and a Green LED is detected from the opposing tile. If so, this means a magnetic bond error exists. During a third check 1033, the Blue LED is on and also Blue LED light is detected from the opposing tile. If so, this means a magnetic bond error exists.

If all checks pass, then the controller of the tile may determine that no magnetic bond error exists on that side of the tile and a pass signal may be generated at 1043. If one or more checks fail, the controller of the tile generates a fail signal. In this case, a magnetic bond correction operation may be performed, for example, in accordance with the embodiments described herein.

At 1050, the controller sends a signal back to the sensor-board state machine indicating whether a pass or fail result was determined to exist. The same state machine may be performed by the opposing tile so that both tiles can confirm whether a proper assembly has occurred or whether, for example, the tiles should be separated and a bonding operation repeated until no magnetic bond error exists. An analogous state machine can be constructed to send a data sequence from monochromatic LEDs on one tile to light sensors on the other tile rather than using RGB LEDs and color sensors, similarly identifying and determining the nature of the bond and otherwise communicating across tiles.

Figure 12:
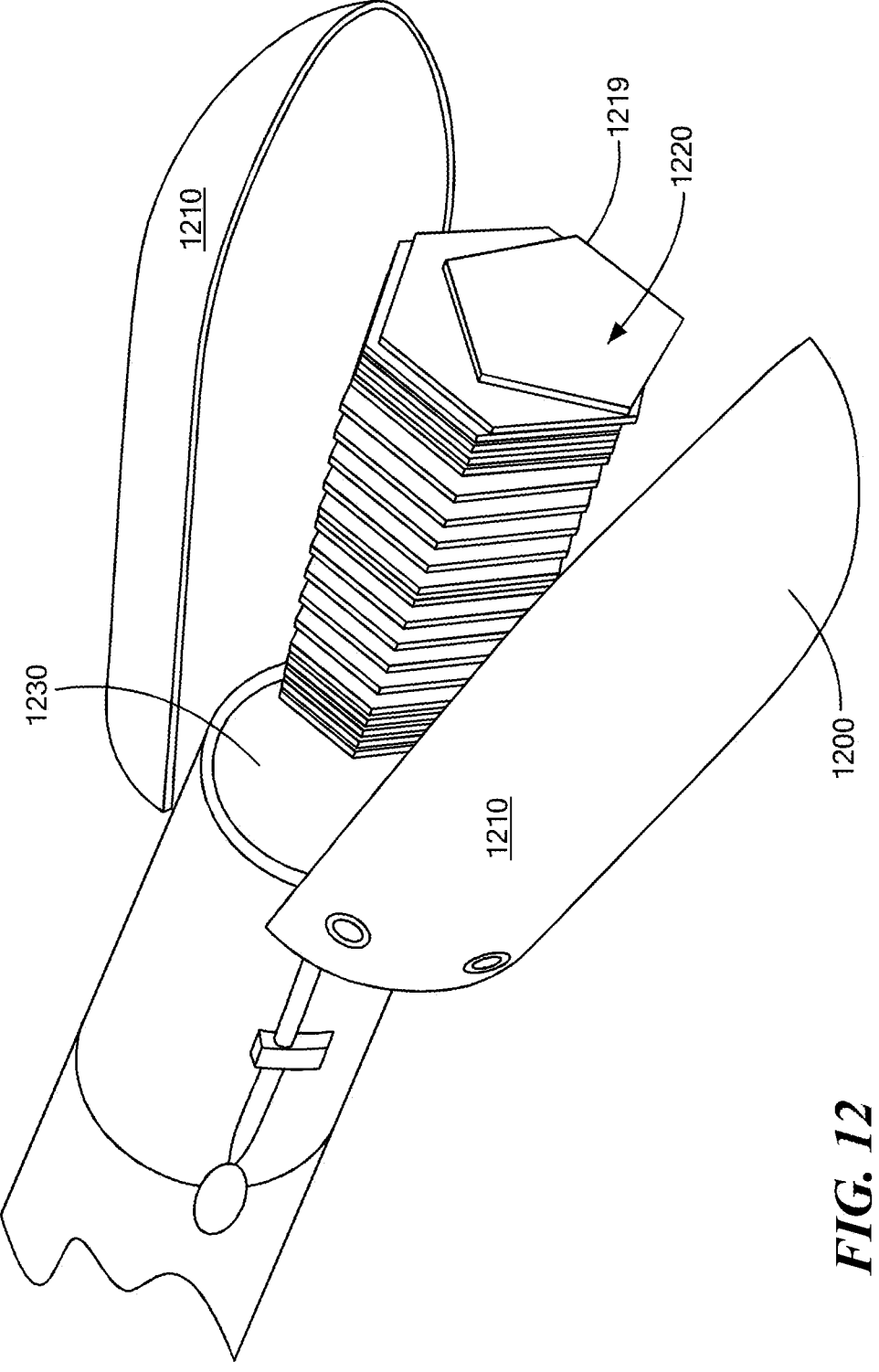
FIG. 12 is an isometric view of an illustrative embodiment for of a system for storing and deploying smart tiles in a microgravity environment.

FIG. 12 is a conceptual diagram showing one example in which a plurality of smart tiles 1219 may be stored and then deployed in a microgravity environment. According to this example, a plurality of smart tiles 1219 in a storage area 1200 which, for example, may be deployed by a space shuttle, spacecraft, or space station or as rocket payload. The number of tiles are sufficient to form at least one completed structure when assembled or to complete one desired task. In one embodiment, the number of tiles may form a plurality of structures when assembled or reassembled, for example, according to different assembled configurations.

Referring to FIG. 12, the storage area 1200 includes a number of retractable doors 1210 which open when (in this case) the rocket has delivered the tiles to an intended orbital location. In the open configuration, the tiles 1219 are held or otherwise secured in place within storage area 1200 and in the form of a single column or stack 1220. In embodiments, tiles 1219 (or stack) may be secured by and deployed from a mechanical holster/magazine structure. During deployment, the smart tiles may be released in with a predetermined trajectory and forced into space, for example, under a force applied by a spring-biased base 1230 of the rocket. Once released, the individual smart tiles are attracted to one another by the magnets to create an intended assembled structure in accordance with the embodiments described herein.

In one embodiment, storage area may be equipped with a power source for charging the battery systems of the tiles. The tiles may be held within the storage area, for example, by nichrome-wire burning of a nylon containment strap. When burned, a spring force may release the tiles in a direction away from the storage area for assembly. A Teflon-coated wiring harness with integrated fuses may be used to prevent the nichrome units from pulling excess current or from straying on too long due to faults in the control code that may produce a smoking event. Other means of securing and releasing tiles on command, as are known in the art, can be also implemented—there have been many different techniques used to hold and release elements on spacecraft and satellites that can be adapted herein. In one embodiment, control signals from a base station may initiate deployment. A wake-up (as described herein) may be transmitted to the smart tiles a predetermined period (e.g., 5 or more seconds) after deployment.

In one embodiment, the smart tiles may be released one-by-one, with each subsequent tile being released only after confirmation is received from the base station that each previous tile has been properly assembled to one or more other tiles. This may allow, for example, the initial two released tiles to properly bond to one another before a third tile is released. In other embodiments, multiple tiles may be released at the same time and allowed to quasi-stochastically assemble from a "swarm" system of multiple released units. In one or more embodiments, the state diagrams may be designed to implement a quasi-stochastic autonomous self-assembly of smart tiles modeled, for example, after Brownian motion and protein folding.

Figures 13A, 13B, 13C, 13D:
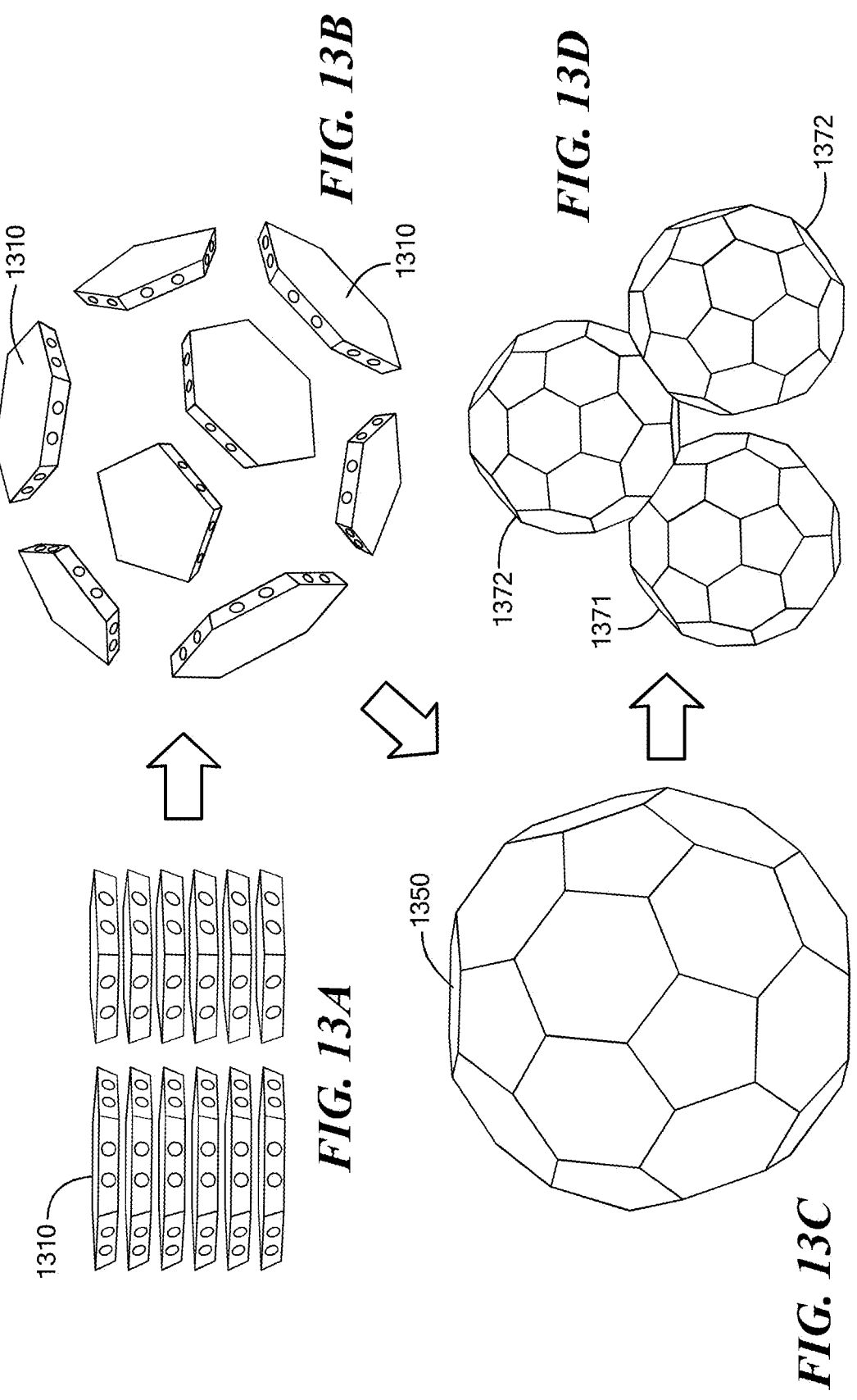
FIG. 13A is a side view of an example configuration in which smart tiles may be stored.
FIG. 13B is an illustrative embodiment of deployed smart tiles which may be the same as or similar to the smart tiles of FIG. 13A.
FIG. 13C is a side view of an illustrative structure formed by joining a plurality of smart tiles which may be the same as or similar to the smart tiles of FIG. 13B.
FIG. 13D is a side view of a plurality of structures that may be formed from a plurality of smart tiles which may be the same as or similar to the smart tiles of FIG. 13A or 13C.

FIGS. 13A-13D are conceptual diagrams showing an example in which a plurality of smart tiles are stored and then deployed in a microgravity environment. In FIG. 13A, a predetermined number of smart tiles 1310 are arranged and stored in a two-stack configuration. In FIG. 13B, when deployed the smart tiles float towards and are attracted to one another in the microgravity environment based on the attractive forces of the electromagnets. In FIG. 13C, the completed assembly is shown in a substantially spherical (or buckyball) configuration 1350, which is formed after the state diagrams have been implemented by the controllers in respective ones of the smart tiles. A similar process may be performed by the single-stack arrangement of FIG. 12 to form an completed structure. In one example, 32 smart tiles are stored and then deployed to create a buckyball structure. In such a case, twelves of the 32 smart tiles may have shells with a pentagonal geometry and the remaining twenty smart tiles may have shells with a hexagonal geometry. Different combinations of tiles with different arrangements of geometrical shapes may be used in different embodiments.

In one embodiment, the assembled tiles in FIG. 13C may be reconfigured into one or more other geometrical structures. In order to accomplish this operation, first, the number of tiles in the structure of FIG. 13C must be reconfigurable into the one or more other geometrical structures. This may be accomplished, for example, in advance by providing the tiles to have different geometrical shapes, e.g., some of the times may have hexagonal shapes and other tiles may have pentagonal shapes.

When a reconfiguration and subsequent reassembly operation is to be performed, the controller of all or a portion of the smart tiles may selectively actuate the magnets on their side faces to repel away the other tiles. As a result, the tiles are suspended in the microgravity environment in a floating but separately spaced relationship. (Certain tiles may have left assembled together in some cases, or all tiles may be separated in other cases). The controllers of the tiles may then implement their respective state diagrams to form the one or more new geometrical shapes. In the example of FIG. 13D, the large single substantially spherical (or buckyball) shape of FIG. 12C is reassembled into three smaller substantially spherical (or buckyball) structures 1371, 1372, and 1373.

In addition to magnetic bonds, a number of additional features may be used to maintain or reinforce the assembly between two tiles. In one embodiment, rotating magnet clamps may be used to apply a holding force between paired tiles. A passive coupling (or "train car coupling") design may be used where curved arms in respective tiles extend and link the tiles together. The arms may move into engagement, for example, by motors in the tiles. In one embodiment, a rack-and-pinion clamping arrangement may be used to provide additional force for holding the tiles together. In one embodiment, a gasket may be provided on the side surfaces to form a pressurized seal between the two tiles. The additional clamping features may aid in maintaining and/or pressurizing the seal. A rack-and-pinion design may cinch and tighten the joint between the tiles across a deformable gasket material to form the seal.

FIG. 14 is a table showing one example of a smart tile configuration and its corresponding features. In this example, the smart tile has a hexagonal shape with a widest diameter of 10 cm. The electromagnets may be EPMs with an SS/NN joint type when a bond is formed between a hexagonal tile and a pentagonal tile, or with an SN/SN joint type with a bond is formed between two hexagonal tiles. The main mother board in the tile shell may include the controller and IMU and TOF circuits, and a peripheral board may be attached to the inner surface of each side of the tile. Each peripheral board may include a corresponding magnetic field sensor and an RGB color sensing, proximity and gesture circuit (e.g., chip), in addition (or replaced by) the other means, such as described earlier of locating tiles, detecting bonds, determining bond quality, and communicating across tiles. Note that this table describes a scaled down tile developed for testing—this system can be scaled up to much larger dimensions aimed at human habitats, storage/operational structures, etc., still using the inventions and systems described herein.

The communications unit may be a Bluetooth Low Energy (BLE) unit and the data storage device may be a Micro SD card. The programming interface for receiving code for the controller and/or other processing features of the tile may be a USB Arduino Bootloader. Power for each of the smart tiles may include a Coin Cell lithium-ion battery, equipped with a recharging circuit, supercapacitor discharge for the EPMs, and corresponding protection circuits.

In addition to these features, active control may be performed for generating a repulsive force to separate improperly bonded electromagnets of adjacent smart tiles. In such a case, the attractive force for bonding electromagnets of the tiles may be achieved by the magnetic core of the EPMs without applying current to their coils, in order to reduce power consumption. The instructions for implementing the state machines and for performing other operations in the smart tile may be executed, for example, through .ino files on the controller, which, for example, may be a Teensy 3.6 microcontroller direct memory access (DMA) controller, but a different type of controller may be used in another embodiment.

Figure 15:
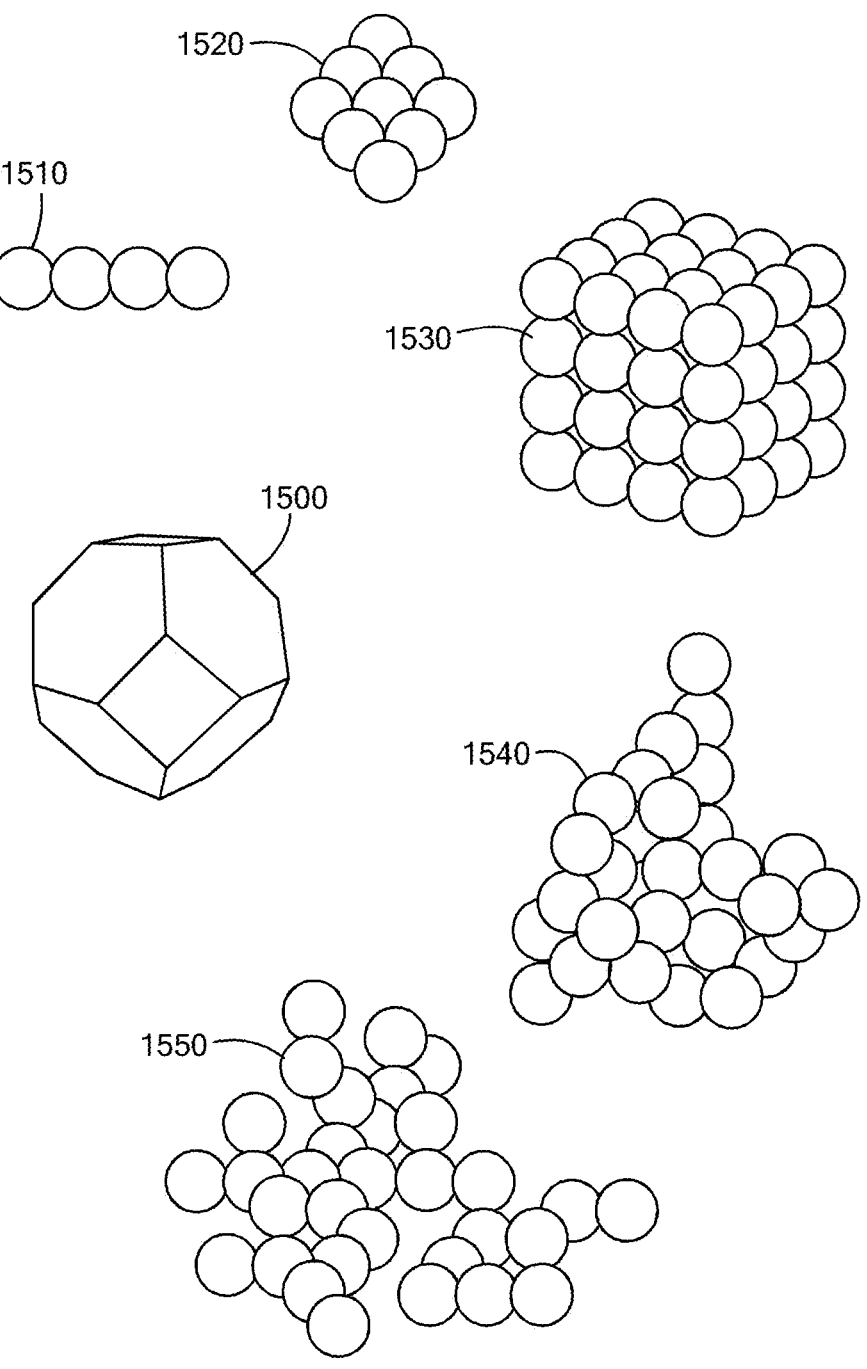
FIG. 15 is a diagram illustrating examples of a plurality of smart tile structures each of which have different shapes.
Figures 16A, 16B, 16C, 16D, 16E, 16F:
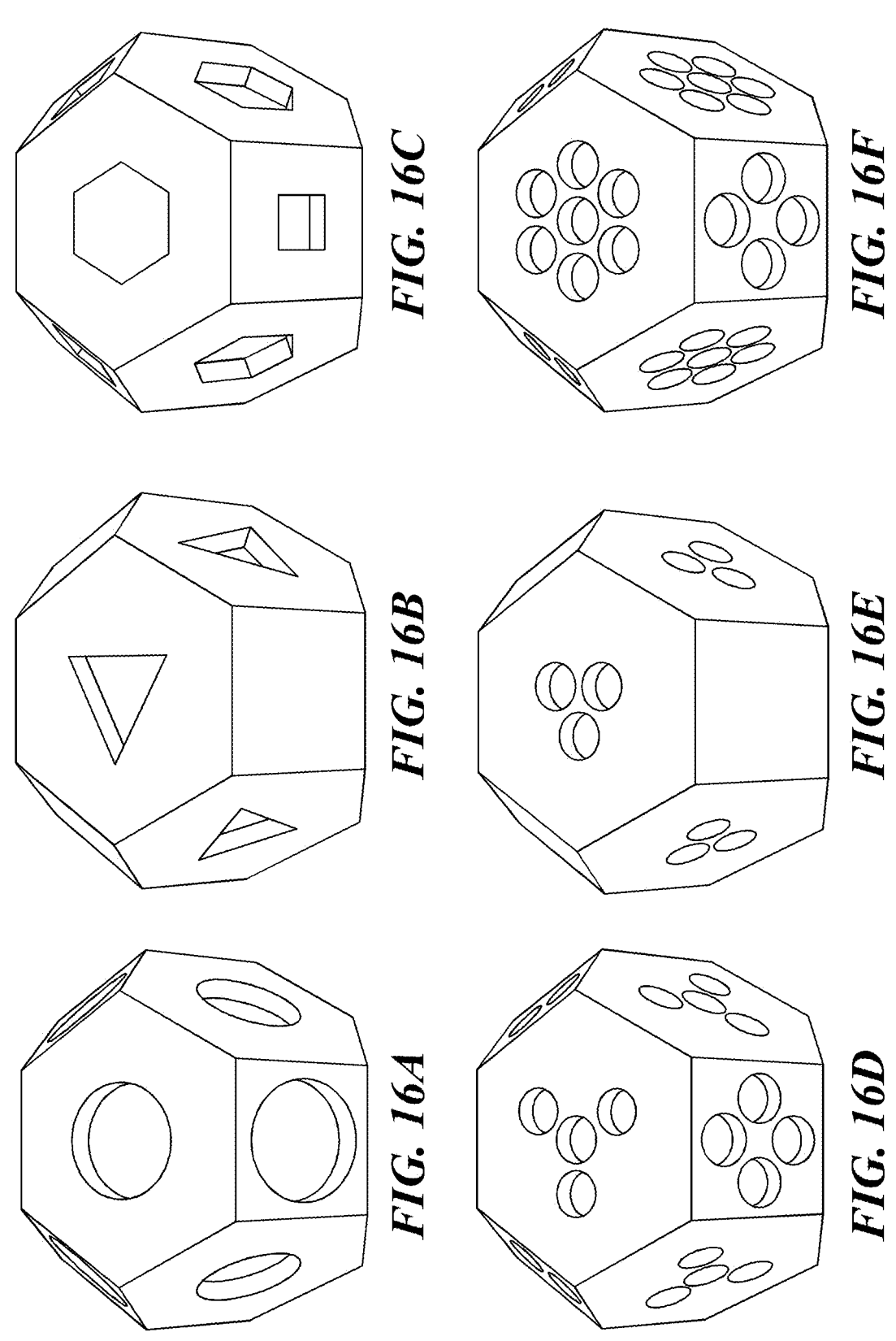
FIG. 16A is a perspective view of a smart tile structure having a first embodiment of a coupling surface.
FIG. 16B is a perspective view of a smart tile structure having a second embodiment of a coupling surface.
FIG. 16C is a perspective view of a smart tile structure having a third embodiment of a coupling surface.
FIG. 16D is a perspective view of a smart tile structure having a fourth embodiment of a coupling surface.
FIG. 16E is a perspective view of a smart tile structure having a fifth embodiment of a coupling surface.
FIG. 16F is a perspective view of a smart tile structure having a sixth embodiment of a coupling surface.

FIG. 15 is conceptual diagram showing an embodiment of how various complex structures may be formed from a plurality of separately assembled geometrical structures. In FIG. 15, each of the structures are shown as spheres for illustrative purposes. But, it is to be understood that the structures shown as spheres actually have geometrical configurations, for example, such as shown by structure 1500.

Referring to FIG. 15, each structure is formed by a collection of smart tiles assembled in accordance with the state diagrams and other embodiments described herein. In order to help to connect or arrange, the individual structures into the complex structure, the upper surfaces of one or more tiles of each structure may be equipped with at least one mating guide. For example, some tiles may have a recess in a predetermined geometrical shape that may serve as the mating guide and other tiles may have a protrusion in a complementary geometrical shape that may serve as the mating guide. When mated, the structures may form the complex shape.

In the example of FIG. 15, a plurality of complex shapes are shown 1510 to 1550 as being formed from assembled basic units 1500 (e.g. serving as a minimum viable unit) having a smaller buckyball shape. In one embodiment, the basic units (or structures) 1500 may be assembled to form a plesiohedron-derived outer shape that provides space-filling opportunities, which, for example, may be used to form multi-module space stations in any number of organic or crystalline configurations. A generative algorithm may programmed into the smart tiles to guide cellular self-assembly for this structure, user-centric programmatic diagrams, and conceptual renderings.

FIGS. 16A to 16F show examples of recess geometries that may serve as mating guides for the different structures that are to be assembled to form the complex structure. These geometries include various combinations of triangles, circles, hexagons, or clusters of such shapes. In some embodiments, the mating guides may be formed on different facets of one or more basic units X00, for example, in cases where these basic units are assembled to multiple other basic units to form the complex structure.

In accordance with one or more of the aforementioned embodiments, a smart tile and an associated system and method are provided for performing autonomous 3D self-assembly structures in a microgravity environment. Examples of the microgravity environment include outer space; examples of environments with greater gravity, such as the application for drone technology, include planet atmospheres (if propellers were added to the tiles). As explained, the platform may include GNC (guidance, navigation and control) hardware, sensing, and software for achieving the self-assembly.

In some implementations, long-range remote sensing and autonomous, directional guidance control may be performed as smart tiles come together and self-right themselves. In one embodiment, hardware units in the platform may perform 3D pivots to move and re-align while maintaining magnetic connectivity. This can be implemented in a variety of different means—for example by employing bearings on the magnets, enabling the magnets or cores to rotate, or applying a slippery substance like Teflon to the outer surfaces of the magnets—other methods of such rotational compliance are known in the art and can be adopted for this function. Hardware units in the platform may operate unconstrained in three dimensions in a free-floating operating environment. The hardware units may include a layer of diagnostic bonding sensing (error detection) and active bonding correction that enables improved control. The physical profile of the hardware units (e.g., mechanical features) may enable forming complicated, 2D surface shells that close to form hollow shapes.

In some implementations, the hardware units are passively drawn together through magnetic force. The hardware units may operate in three dimensions and self-right themselves through autonomous sensing, actuation code and a hardware platform that enable 3D pivots. In some implementations, the platform self-assembles quasi-stochastically without pre-defined path planning. The platform may perform dynamic, sensor-mediated autonomous reconfiguration.

In some embodiments, the system may function autonomously and may add additional degrees of freedom for joint-agnostic self-reconfigurability. In some implementations, one or more of the following features may be performed or included: (a) incoming bonding diagnosis sensor algorithm/autonomous functionality; (b) incoming bonding diagnosis physical tile response and docking maneuvers (e.g., magnet torque control); (c) self-assembly combo mechanism (including EPM-mediated bonding joint, mechanical tile interface design, mechanical self-righting features, sensor confirmation, algorithm state-machine progression to next functionality step); (d) self-disassembly combo mechanism (including autonomous error detection and correction, EPM power system for controlled pulse-off and tile separation); (e) self-reconfigurability (e.g., state-machine algorithm for autonomous reconfigurability, paired with the hardware actuation to make this happen); (f) docking and undocking operation in a free-floating (e.g. microgravity) environment or aloft (e.g. drone); (g) three dimensional space constellation configuration; and (h) mesh or star network and distributed system for many tiles simultaneously self-assembling/self-disassembling while following an autonomous construction algorithm (e.g., for "modular, in-space swarm construction").

The smart tile may include a controller implemented, for example, as one or more computers (e.g., integrated circuits, microcontrollers, controllers, microprocessors, processors, field-programmable-gate arrays, personal computers, onboard computers, remote computers, servers, network hosts, or client computers) programmed and specially adapted to: (1) perform any computation, calculation, program, state machine or algorithm described herein; (2) receive and handle purely autonomous signals, independent of human input; (3) receive signals indicative of human input; (4) output signals for controlling transducers for outputting information in human perceivable format; (5) process data, to perform computations, to execute any algorithm or software and (6) control the read or write of data to and from memory devices. The one or more computers may be connected to each other or to other components in the system either: (a) wirelessly, (b) by wired or fiber optic connection, or (c) by any combination of wired, fiber optic or wireless connections.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target where the magnetic field sensor is used in combination with a back-biased or other magnet, a magnetic field sensor that senses a magnetic field density of a magnetic field and a magnetic field sensor that senses a magnetic field magnitude of a magnetic field.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. If the magnetic field is pulsed or dynamic, the coils wound around other electromagnets or EPMs can be also used as magnetic sensors.

As is known, there are different types of Hall effect elements, for example, a planar Hall element, a vertical Hall element, and a Circular Vertical Hall (CVH) element.

As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). Of these magnetoresistance elements, the GMR, MTJ, and the TMR elements operate with spin electronics (i.e., electron spins), which result in a resistance of the GMR element or the TMR element being related to an angular direction of a magnetization in a so-called "fee-layer."

The magnetic field sensing element may be a single element or, alternatively, may include two or more magnetic field sensing elements arranged in various configurations, e.g., a half bridge or full (Wheatstone) bridge. Depending upon the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate. Search coil implementations (as potentially realized by the electromagnet or EPM windings themselves) are sensitive along the axis of the winding (or direction of the core).

As used here, the term "motion" is used to describe a variety of types of movement associated with an object, for example, including but not limited to rotational movement (or "rotation") and linear (or "rectilinear") movement of the object. A "motion detector" may, for example, detect rotation of an object. A "rotation detector" is a particular type of "motion detector."

As used herein, the term "module" is used to describe a "processor." While examples below describe circuits for detecting motion of specific objects (e.g., knobs in automobile headlight switch assemblies), it should be appreciated that the circuits disclosed herein may be found suitable for detecting motion of a variety of objects. Additionally, while magnetic field sensors including a specific number of magnetic field sensing elements (e.g., two sensing elements) are described in several examples below, such is discussed to promote simplicity, clarity and understanding in the description of the concepts, systems, circuits and techniques sought to be protected herein. Such is not intended to be, and should not be construed as, limiting. The magnetic field sensors disclosed herein may be implemented using more than or less than the specific number of sensing elements. It follows that the term "sensing element" and can be used to describe more than one physical semiconductor structure (for example, more than one magnetoresistance element yoke) coupled together in such a way as to generate one or more magnetic field signals in response to a magnetic field.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, processors, logic, and other signal generating and signal processing features of the embodiments described herein may be implemented in non-transitory logic which, for example, may include hardware, software, or both. When implemented at least partially in hardware, the controllers, processors logic, and other signal generating and signal processing features of the embodiments described herein may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors logic, and other signal generating and signal processing features of the embodiments described herein may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments described herein.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. The features of any one embodiment may be combined with features of one or more other embodiments described herein to form additional embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications of component parts and/or arrangements, alternative uses will also be apparent to those skilled in the art.

We claim:

1. A system for autonomous 3D self-assembly, spatial docking and reconfiguration tile, the system comprising:
a shell having a first geometrical shape;
an arrangement of first magnets coupled to the shell;
a light emitter coupled to the shell; and
a controller configured to control operation of the arrangement of first magnets to couple the shell with at least one other shell in a microgravity environment, wherein the arrangement of first magnets are controlled to mate with a complementary arrangement of second magnets on the at least one other shell when the complementary arrangement of second magnets is within a range of a magnetic attractive force of the arrangement of first magnets and wherein the controller is coupled to the light emitter and further configured to control the light emitter to transmit to a modulated optical signal having a code to: indicate a location of the shell to at least one other shell; and/or communicate any other data to at least one other shell.

2. The system of claim 1 further comprising a light detector coupled to the shell and to the controller and wherein the controller is further configured to receive a modulated optical code from the at least one other shell.

3. The system of claim 2 wherein the light detector is configured to receive a confirmation signal from the at least one other shell and the controller is configured to determine a status of a magnetic bond between one of the first magnets and one of the second magnets based upon the confirmation signal received from the at least one other shell and wherein the confirmation signal is provided as a modulated light signal.

4. The system of claim 3 wherein the modulated light signal comprises at least one of:
a first modulated optical code indicative of a magnetic bond error; and
a second, different modulated optical code indicative of an aligned magnetic bond.

5. The system of claim 1 wherein the light emitter is configured to transmit an optical a code via an optical link.

6. The system of claim 5 further comprising a modulator configured to modulate coils that drive the arrangement of first magnets so as to modulate the optical code being transmitted across the optical link in response to a pair of shells coming into proximity with one another.

7. The system of claim 1 wherein the controller is further configured to transmit the code via an inductive link.

8. The system of claim 1 wherein the light emitter is configured to transmit the code by transmitting a series of optical signals having one or more colors.

9. A tile, comprising:
a shell having a first geometrical shape;
an arrangement of first magnets coupled to the shell;
a light emitter coupled to the shell; and
a controller configured to control operation of the arrangement of first magnets to couple the shell with a shell of at least one other tile in a microgravity environment, wherein the arrangement of first magnets is controlled to mate with a complementary arrangement of second magnets on the shell of the at least one other tile when the complementary arrangement of second magnets is within a range of a magnetic attractive force of the arrangement of first magnets and wherein the controller is coupled to the light emitter and further configured to control the light emitter to transmit a modulated optical signal having a code to indicate a location of the tile and/or communicate any other data to the at least one other tile.

10. The tile of claim 9 further comprising a light detector coupled to the shell and to the controller and wherein the controller is further configured to receive a modulated optical code from at least one other tile.

11. The tile of claim 10 wherein the light detector is configured to receive a confirmation signal from at least one other tile and the controller is further configured to determine the status of a magnetic bond between one of the first magnets and one of the second magnets based upon the confirmation signal received from the at least one other tile and wherein the confirmation signal is provided as a modulated light signal.

12. The tile of claim 11 wherein the modulated light signal comprises at least one of:
a first modulated optical code indicative of a magnetic bond error; and
a second, different modulated optical code indicative of an aligned magnetic bond.

13. In a zero gravity (0 G) environment, a system for identifying and aligning tiles with different geometrical configurations to form a predetermined configuration of tiles, the system comprising:
(a) a magnetic field sensor configured to sense a magnetic field on a tile and to provide a tile identification signal in response thereto;
(b) means, coupled to the magnetic field sensor, for identifying the tile based upon a tile identification signal sense; and (c) means for aligning a tile within a predefined pattern of tiles to form a predetermined configuration of tiles in a 0 g environment.

14. The system of claim 13 wherein the magnetic field sensor comprises a magnetometer.

15. The system of claim 13 further comprising means for joining two or more aligned tiles.

16. The system of claim 13 wherein at least two tiles have different geometric shapes.

17. The system of claim 13 wherein at least two tiles have different physical features.

* * * * *